(12) United States Patent
Feldhaus et al.

(10) Patent No.: US 7,957,940 B2
(45) Date of Patent: Jun. 7, 2011

(54) METHOD AND SYSTEM FOR THE DETECTION AND/OR REMOVAL OF SINUSOIDAL INTERFERENCE SIGNALS IN A NOISE SIGNAL

(75) Inventors: Gregor Feldhaus, Munich (DE); Hagen Eckert, Mering (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 86 days.

(21) Appl. No.: 12/430,377

(22) Filed: Apr. 27, 2009

(65) Prior Publication Data
US 2009/0259439 A1    Oct. 15, 2009

Related U.S. Application Data

(62) Division of application No. 11/333,772, filed on Jan. 17, 2006, now Pat. No. 7,840,384.

(30) Foreign Application Priority Data

Jan. 14, 2005 (DE) .......... 10 2005 001 932
Feb. 25, 2005 (DE) .......... 10 2005 008 734

(51) Int. Cl.
*H04B 15/00* (2006.01)
(52) U.S. Cl. ...................................................... 702/191
(58) Field of Classification Search .......... 702/191, 702/195
See application file for complete search history.

(56) References Cited

U.S. PATENT DOCUMENTS

| | | | |
|---|---|---|---|
| 4,456,959 A | 6/1984 | Hirano et al. | |
| 4,853,903 A * | 8/1989 | Linville et al. | 367/46 |
| 4,982,150 A | 1/1991 | Silverstein et al. | |
| 5,400,265 A | 3/1995 | Kauppinen | |
| 5,440,311 A | 8/1995 | Gallagher et al. | |
| 7,068,221 B2 * | 6/2006 | Xin | 342/432 |
| 7,406,261 B2 | 7/2008 | Shattil | |
| 7,840,384 B2 * | 11/2010 | Feldhaus et al. | 702/191 |
| 7,840,385 B2 * | 11/2010 | Feldhaus et al. | 702/191 |
| 2003/0014248 A1 | 1/2003 | Vetter | |
| 2003/0125091 A1 * | 7/2003 | Choi et al. | 455/562 |
| 2003/0140771 A1 | 7/2003 | Ohshima | |
| 2004/0178951 A1 * | 9/2004 | Ponsford et al. | 342/192 |
| 2006/0029142 A1 | 2/2006 | Arad | |

(Continued)

FOREIGN PATENT DOCUMENTS

EP    1 626 516 A2    2/2006

OTHER PUBLICATIONS

German Search Report for Application No. 10 2005 008 734.5 dated Feb. 25, 2005, English translation of pertinent pp. 2 and 4.

(Continued)

*Primary Examiner* — Michael P Nghiem
(74) *Attorney, Agent, or Firm* — Ditthavong Mori & Steiner, P.C.

(57) ABSTRACT

A method for removing sinusoidal interference signals from a noise signal. The method includes transforming a measured signal ($x(t)$, $x(\mu \cdot \Delta t)$), which is composed of a limited number of sinusoidal interference signals ($A_k \cdot e^{j(\omega_k t + \phi_k)}$, $A_k \cdot e^{j(\omega_k \mu \cdot \Delta t + \phi_k)}$) and a white noise signal ($w(t)$, $w(\mu \cdot \Delta t)$), into a subspace containing noise components and a subspace containing interference-signal components, and forming the spectrum of only the noise signal using the subspace containing the noise components. The entire frequency range is split into several frequency bands ($v$), in which each measured signal ($x(t)$, $x(\mu \cdot \Delta t)$) consists of a limited number ($p(v)$) of sinusoidal interference signals and a white noise signal.

11 Claims, 11 Drawing Sheets

U.S. PATENT DOCUMENTS

2006/0195279 A1* 8/2006 Feldhaus et al. ............... 702/75
2006/0195501 A1 8/2006 Feldhaus et al.
2008/0177490 A1 7/2008 Feldhaus et al.
2009/0259439 A1 10/2009 Feldhaus et al.

OTHER PUBLICATIONS

Hayes, H., "Statistical digital signal processing and modeling," John Wiley & Sons, 1996, pp. 451-469.

U.S. Office Action for corresponding U.S. Appl. No. 11/333,772 dated Feb. 25, 2009.

U.S. Office Action for corresponding U.S. Appl. No. 11/333,772 dated Jan. 17, 2008.

U.S. Office Action for corresponding U.S. Appl. No. 11/333,772 dated Mar. 31, 2010.

U.S. Office Action for corresponding U.S. Appl. No. 11/333,772 dated May 29, 2009.

U.S. Office Action for corresponding U.S. Appl. No. 11/333,772 dated Oct. 28, 2009.

U.S. Office Action for corresponding U.S. Appl. No. 11/966,366 dated Apr. 1, 2010.

* cited by examiner

METHOD AND SYSTEM FOR THE DETECTION AND/OR REMOVAL OF SINUSOIDAL INTERFERENCE SIGNALS IN A NOISE SIGNAL

CROSS-REFERENCE TO RELATED APPLICATION

The present application is a divisional application of U.S. Ser. No. 11/333,772, now U.S. Pat. No. 7,840,384, filed on Jan. 17, 2006, and claims priority to German Application No. 10 2005 001 932.3, filed on Jan. 14, 2005, and German Application No. 10 2005 008 734.5, filed on Feb. 25, 2005, the entire contents of which are herein incorporated by reference.

BACKGROUND OF THE INVENTION

1. Field of the Invention

The invention relates to a method and a system for the detection and/or removal of sinusoidal interference signals in a noise signal.

2. Discussion of the Background

As illustrated in FIG. 1, measured noise signals conventionally comprise superimposed sinusoidal interference signals. The sources of these sinusoidal interference signals are to be found either internally within the device or externally. Some of the frequencies and interference lines are known in advance (network hum up to 10 harmonics, subsidiary lines of an internal frequency synthesiser, crosstalk from frequency dividers, microphone effects, for example, from fans) and some must still be determined.

These spectral lines associated with sinusoidal interference signals can be disturbing, for example, in the measurement of phase noise and must therefore be identified and removed as well as possible from the noise measuring curve. However, in some applications, it is also important just to measure the frequencies and power levels of the sinusoidal interference signals as accurately as possible.

In the context of a high-precision spectral analysis of a measured signal, it is therefore desirable to identify the individual spectral lines associated with the sinusoidal interference signals from the other spectral components of the measured signal, to measure the frequencies and power levels of the identified spectral lines and, if required, for example, in the case of a noise measurement, to remove the identified spectral lines completely from the measured spectrum.

According to the prior art, graphic methods are used for the identification of sinusoidal interference signals in a noise signal.

In one graphic method, as shown in FIG. 2, a threshold-value line is placed over the noise curve. All of the components of the spectrum disposed above this threshold-value line are recognised as spectral lines. The left and right intersection of the peak lines identified respectively by the threshold-value line with the peak-free noise curve is determined and linked by means of an appropriate interpolation.

The identification of spectral lines associated with sinusoidal interference signals in a noise spectrum requires a high-resolution Fourier Transform. Spectral lines disposed close together cannot be identified separately from one another using graphic means. The use of a constant threshold-value line is not appropriate in the case of a phase noise curve, which provides a monotonously descending course. Consequently, a threshold-value line must be used, which provides a course, which is constant only in very small regions, or a course which is complementary to the phase-noise curve. In such a case, measuring the position of spectral lines is disadvantageously still only possible in a heuristic manner. A further disadvantage of the graphic method is the fact that, because of the interpolation of the noise curve, the precise information about the noise curve in the region of the identified spectral lines is lost. Furthermore, with numerous spectral lines in the noise curve, the graphic imprint of the spectral curve is destroyed as a result of the numerous interpolations.

SUMMARY OF THE INVENTION

The invention is therefore based upon the object of providing a method and a system for the identification and/or removal of an unknown number of sinusoidal interference signals in a generally coloured noise signal, which comprises a Fast Fourier Transform with a practicable frequency resolution and, at the same time, includes an efficient numerical method.

The present invention advantageously provides a method for the detection of sinusoidal interference signals in a noise signal, a system for the identification of sinusoidal interference signals in a noise signal, a method for the removal of sinusoidal interference signals from a noise signal and a system for the removal of sinusoidal interference signals from a noise signal.

With the method and system according to the invention for the detection of sinusoidal interference signals in a noise signal, the entire frequency range of the noise signal to be measured is subdivided via a Fast Fourier Transform filter bank into several frequency bands, in which the respective noise signal is approximately white and additionally contains only a limited, comparatively small number of spectral lines associated with sinusoidal interference signals.

Accordingly, the conditions are fulfilled for a determination of the frequencies and power level of the sinusoidal interference signals, using a method for eigenvalue analysis of autocorrelation matrices, which are obtained from the measured signal comprising the noise signal and superimposed sinusoidal interference signals. In this context, the eigenvalues for the autocorrelation matrix obtained for each frequency band are split respectively into the eigenvalues associated with the noise components and the eigenvalues associated with the signal components. The eigenvalues associated with the noise components are the respectively lowest eigenvalues and provide a significant value-difference relative to the eigenvalues associated with the signal components. Using the eigenvectors associated with the noise eigenvalues, an estimation function is formed, of which the maxima represent the power levels for the sought sinusoidal interference signals associated with the respective frequencies.

By way of example, the estimation function based upon the MUSIC (Multiple Signal Classification) method can be used as the estimation function. However, other frequency-estimation methods based upon the analysis of eigenvalues of autocorrelation matrices can also be used as an alternative.

A Fast Fourier Transform filter bank is used to generate frequency bands with a frequency bandwidth, in which the noise signal can be assumed to be white.

On the basis of the windowing of the Fast Fourier Transform filter bank, which is realised, for example, via a Chebyshev filter, the spectral lines of sinusoidal interference signals appear not only in one frequency band, but also in several adjacent frequency bands on the left and the right. These additional spectral lines are undesirable; they must be identified as such and must therefore be taken into consideration in the identification and removal of the spectral lines.

On the basis of the window function, the spectral lines of sinusoidal interference signals extend over several frequency bands. With a scaling according to the invention of the frequency difference of each of these spectral lines generated from the window function in the respective frequency band to the mid-frequency of the respective frequency band with the bin width of the respective FFT used, it is comparatively simple, by deconvolution according to the invention, to recombine the power levels determined via the estimation function and associated with the individual interference spectral lines, which are distributed over several frequency bands.

If two or more sinusoidal interference signals have a frequency, which is disposed respectively in two or more adjacent frequency bands, and at the same time, provide the same scaled frequency on the basis of their frequency position relative to the mid-frequency of the respective frequency band, and accordingly come to be disposed at the same frequencies over several adjacent frequency bands, the power levels of the spectral lines associated with the individual sinusoidal interference signals can be separated according to the invention by means of a deconvolution.

Since the use of a deconvolution can, under some circumstances, lead to incorrect power levels, these must be selected via plausibility criteria. In this context, identified power levels are only shown as correct power levels, if they are disposed above a certain specified noise power threshold and, at the same time, above a dynamic threshold value, which is associated with the maximum power level of all power levels with approximately the same scaled frequency.

With the method and the system according to the invention for the removal of sinusoidal interference signals from a noise signal, the entire frequency range of the measured signal is split into several frequency bands, in an exactly analogous manner to the method and the system according to the invention for the identification of sinusoidal interference signals in a noise signal, by means of a Fast Fourier Transform filter bank. The frequencies of the sinusoidal interference signals, which are determined either through the method and system according to the invention for the identification of sinusoidal interference signals in a noise signal with the above named features or which are specified by the user, are assigned to the individual frequency bands. In this context, it is also taken into consideration that, spectral lines from a sinusoidal interference signal occur not only in a single frequency band, but in several adjacent frequency bands as a result of the windowing of the FFT.

Starting from the number of spectral lines per frequency band to be removed, the noise power of the respective frequency band is determined according to the invention from a given number of lowest eigenvalues of an autocorrelation matrix associated with the respective frequency band. The number of lowest eigenvalues of the autocorrelation matrix associated with the respective frequency band, which are associated with the individual noise components of the measured signal comprising the noise signal and the sinusoidal interference signals, is determined, respectively, via an analysis of all eigenvalues of the autocorrelation matrix associated with each frequency band, in that all of the eigenvalues associated with the respective noise components are minimal and provide a significant value difference relative to the signal components—the sinusoidal interference signals. With a specified number of interference-signal spectral lines to be removed, the number of eigenvalues associated with the noise signal can, according to the invention, also be determined from the matrix dimension minus the specified number of interference-signal spectral lines to be removed. The spectrum of the noise signal after the removal of the sinusoidal interference signals is derived according to the invention from the combination of all of the noise spectra associated with the individual frequency bands.

BRIEF DESCRIPTION OF THE DRAWINGS

An embodiment of the method according to the invention and the system according to the invention for the identification of sinusoidal interference signals in a noise signal and an embodiment of the method according to the invention and the system according to the invention for the removal of sinusoidal interference signals from a noise signal are explained in greater detail below with reference to the drawings. The drawings are as follows.

DETAILED DESCRIPTION OF EMBODIMENTS OF THE INVENTION

Figure 1:
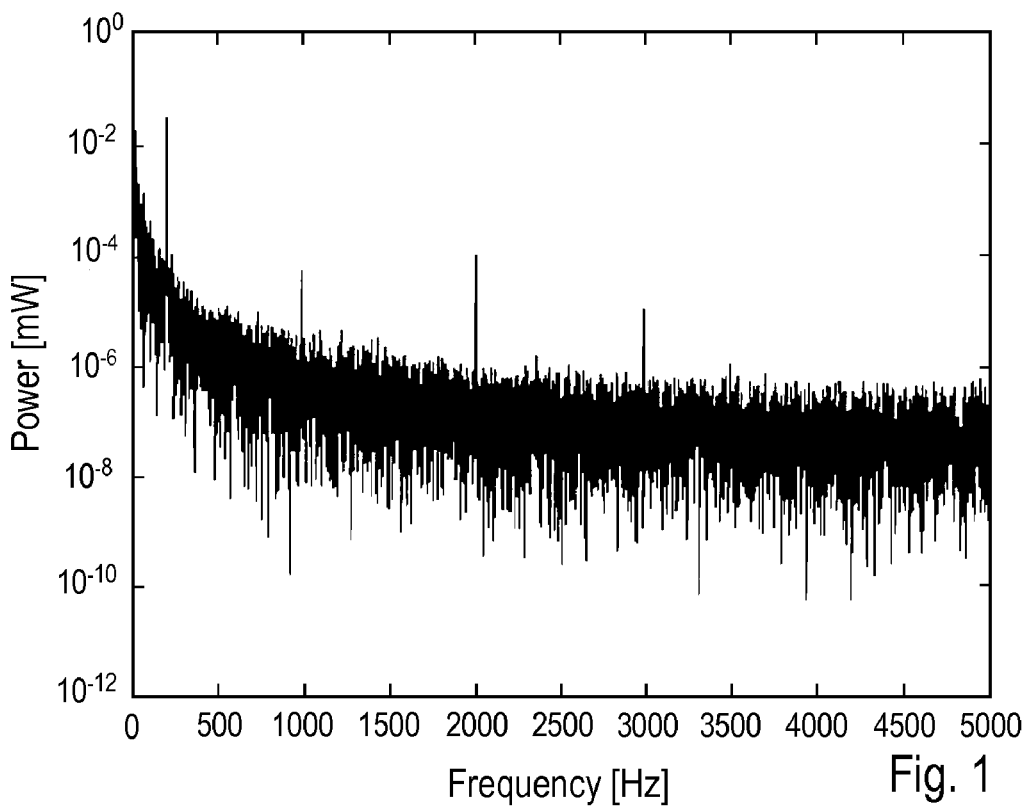
FIG. 1 shows a display of a measured spectrum of a noise signal with superimposed interference-signal spectral lines.
Figure 2:
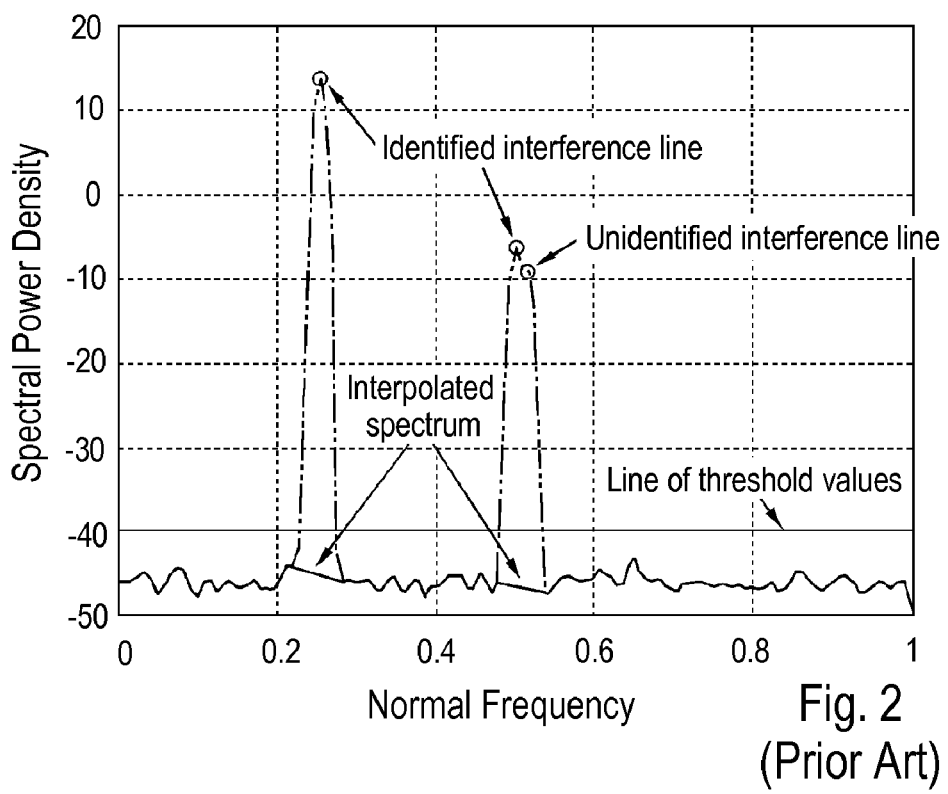
FIG. 2 shows a spectral display of a noise spectrum with the interference-signal spectral lines removed on the basis of graphic methods.

Before describing the system according to the invention and the method according to the invention for the detection of sinusoidal interference signals in a noise signal and the system according to the invention and the method according to the invention for the removal of sinusoidal interference signals from a noise signal in greater detail with reference to FIGS. 9, 10, 11, 12, 13, and 14, the following section presents the theoretical background, on which the invention is based.

According to the invention, the entire frequency range of the measured signal comprising the noise signal and sinusoidal interference signals is split into several frequency bands, in which the respective noise signal is approximately white and which each contain only a limited, comparatively small number of sinusoidal interference signals. The subdivision into several frequency bands takes place via a filter bank, which is realised in the form of a Fast Fourier Transform (FFT) according to FIG. 3.

An FFT filter bank 1, which, according to the invention, generates a number of frequency bands corresponding to its FFT length $N_{FFT}$, accordingly comprises a total of $N_{FFT}$ signal paths, which, from a measured signal x(t), leads to a total of $N_{FFT}$ time-discrete output signals $x_1(\mu \cdot \Delta t)$, $x_2(\mu \cdot \Delta t)$, ..., $x_{NFFT}(\mu \cdot \Delta t)$. With a real measured signal x(t) and therefore with a symmetrical spectrum X(f), the FFT needs to be evaluated only in one sideband. In this case, the number of frequency bands to be observed is reduced to $N_{FFT}/2$. The input signal x(t) is subjected in each of the $N_{FFT}$ signal paths first to a windowing $2_1, 2_2, \ldots, 2_{NFFT}$ with the respectively-associated impulse response $h_{window1}(t)$, $h_{window2}(t)$, ..., $h_{windowNFFT}(t)$. The mid-frequencies of the respective window transmission function $H_{window1}(f)$, $H_{window2}(f)$, ..., $H_{WindowNFFT}(f)$ correspond with the frequencies $v \cdot f_0$ of the individual FFT bins and also form the main frequencies of the individual frequency bands $v$. The bandwidth of each of the window transmission functions $H_{Window1}(f)$, $H_{Window2}(f)$, ..., $H_{WindowNFFT}(f)$ is therefore derived as follows—under the ideal condition of rectangular frequency spectra of the window transmission functions $H_{Window1}(f)$, $H_{Window2}(f)$, ..., $H_{WindowNFFT}(f)$—from the bin width $f_0$ of the FFT and also corresponds to the bandwidth $\Delta f$ of the respective frequency bands.

After each windowing $2_1, 2_2, \ldots, 2_{NFFT}$, the respectively windowed signal is mixed in subsequent down mixings $3_1, 3_2, \ldots, 3_{NFFT}$, in each case with the frequency $f_0$, $2 \cdot f_0, \ldots, N_{FFT} \cdot f_0$ into the respective frequency band in the baseband.

Finally, with the signals windowed and mixed down into the baseband, an undersampling $4_1, 4_2, \ldots, 4_{NFFT}$ takes place in the individual signal paths with the respective sampling rate $$\frac{1}{N_{FFT} \cdot \Delta t},$$

which leads to the individual time-discrete output signals $x_1(\mu \cdot \Delta t), x_2(\mu \cdot \Delta t), \ldots, x_{NFFT}(\mu \cdot \Delta t)$ at the respective outputs of the individual signal paths. Each of the time-discrete output signals $x_1(\mu \cdot t), x_2(\mu \cdot \Delta t), \ldots, x_{NFFT}(\mu \cdot \Delta t)$ is assigned to one of the total of $N_{FFT}$ frequency bands and each provides an approximately white noise signal and has a limited, comparatively small number of sinusoidal interference signals.

Figure 4A:
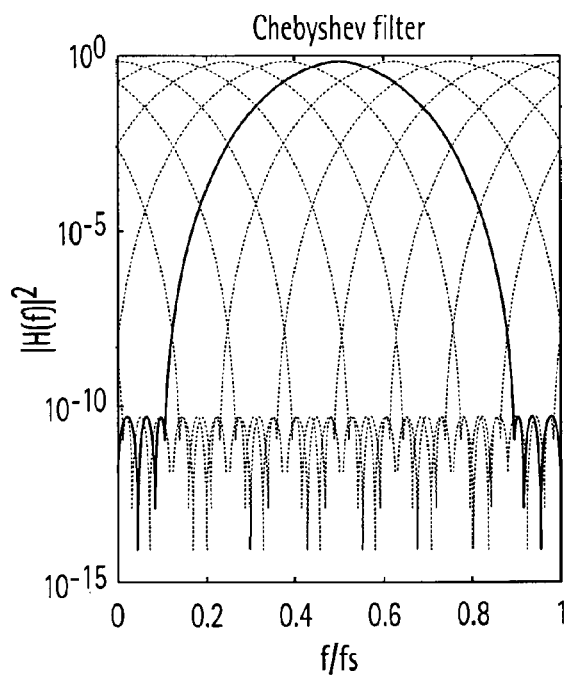
FIGS. 4A, 4B show a frequency spectrum of a Chebyshev window and a rectangular window.
Figure 4B:
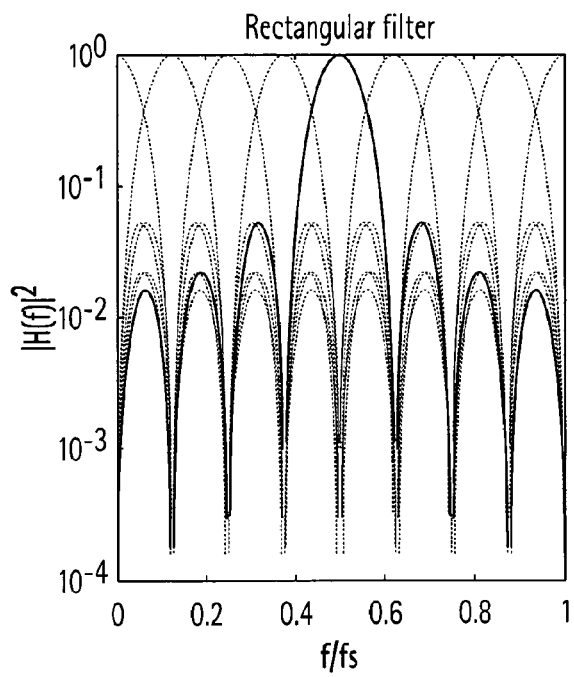

In reality, the window transmission functions $H_{Window1}(f)$, $H_{Window2}(f), \ldots, H_{WindowNFFT}(f)$ do not provide rectangular frequency spectra, but, with a Chebyshev filter, as shown in FIG. 4A or with a rectangular filter as shown in FIG. 4B, provide several "subsidiary lobes" disposed to the left and right of a "main lobe". While a rectangular filter provides a narrow "main lobe" and therefore most nearly fulfils the requirement for the realisation of a high frequency resolution corresponding to the bin width $f_0$ of the FFT, one spectral line disadvantageously continues periodically in the adjacent "subsidiary lobes" corresponding to the attenuation of the respective "subsidiary lobe" (so-called "leakage effect"). In the case of the Chebyshev filter, by contrast, the periodic continuation in the individual "subsidiary lobes" of spectral lines occurring in the "main lobe" can be reduced in a targeted manner to a negligible value by attenuating the "subsidiary lobes", while the bandwidth of the "main lobe" disadvantageously extends over several FFT bins and therefore over several frequency bands. The removal according to the invention of the disadvantageous influence of the window function over several frequency bands is explained in greater detail below.

The output signal $x(\mu \cdot \Delta t \cdot N_{FFT})$ in the $v$-$^{th}$ frequency band generated by the FFT filter bank is derived, in the case of a time-discrete input signal $x(\mu \cdot \Delta t)$, according to equation (1):

$$x(\mu \cdot \Delta t \cdot N_{FFT}) = \Delta t \cdot \sum_{\mu} x(\mu \Delta t) \cdot h(\mu \Delta t) \cdot e^{-j \frac{2\pi}{N_{FFT}} v \mu} \quad (1)$$

If the time-discrete input signal $x(\mu \cdot \Delta t)$ contains a sinusoidal interference signal with a frequency $f_k$, which is disposed exactly on the mid-frequency of the FFT bin ($f_k = v \cdot f_0$), then, with $x(\mu \Delta t) = e^{j 2\pi v f_0 \mu \Delta t}$ and the relationship $$f_0 = \frac{1}{N_{FFT} \Delta t},$$

an output signal $x(\mu \cdot \Delta t \cdot N_{FFT})$ of the FFT filter bank is derived according to equation (2):

$$x(\mu \cdot \Delta t \cdot N_{FFT}) = \Delta t \cdot \sum_{\mu} e^{j 2\pi v f_0 \mu \Delta t} \cdot h(\mu \Delta t) \cdot e^{-j \frac{2\pi}{N_{FFT}} v \mu} = \quad (2)$$
$$= \Delta t \cdot \sum_{\mu} h(\mu \Delta t) = const.$$

If the frequency $f_k$ of the sinusoidal interference signal is disposed centrally between two FFT bins $$f_k = v f_0 \pm \frac{f_0}{2},$$

then the output signal $x(\mu \cdot \Delta t \cdot N_{FFT})$ of the FFT filter bank in the $v$-$^{th}$ frequency band provides a rotating phasor with maximum rotational velocity $$\frac{f_0}{2}$$

according to equation (3)

$$x(\mu \cdot \Delta t \cdot N_{FFT}) = \Delta t \cdot \sum_{\mu} e^{j 2\pi \left(v f_0 \pm \frac{f_0}{2}\right) \mu \Delta t} \cdot h(\mu \Delta t) \cdot e^{-j \frac{2\pi}{N_{FFT}} v \mu} = \quad (3)$$
$$= \Delta t \cdot \sum_{\mu} h(\mu \Delta t) \cdot e^{\pm j 2\pi \frac{f_0}{2} \Delta t}$$

As a result of the windowing, spectral lines of sinusoidal interference signals, of which the frequency $f_k$ comes to be disposed in a given frequency band, are also detected in adjacent frequency bands. The amplitude of these subsidiary spectral lines is derived from the attenuation of the window transmission function. According to equation (4), the phases of the subsidiary spectral lines are constant, subject to the condition of a real and symmetrical (even) window function $h_{Window}(t)$ and therefore also of a real and even window transmission function $H_{Window}(f)$ relative to the phase of the main spectral line generated by the "main lobe" of the window transmission function:

$$\angle(A_k \cdot \delta(f-f_k) * H_{Window}(f)) = \angle(A_k \cdot H_{Window}(f-f_k)) = \angle A_k = \text{const.} \quad (4)$$

Figure 3:
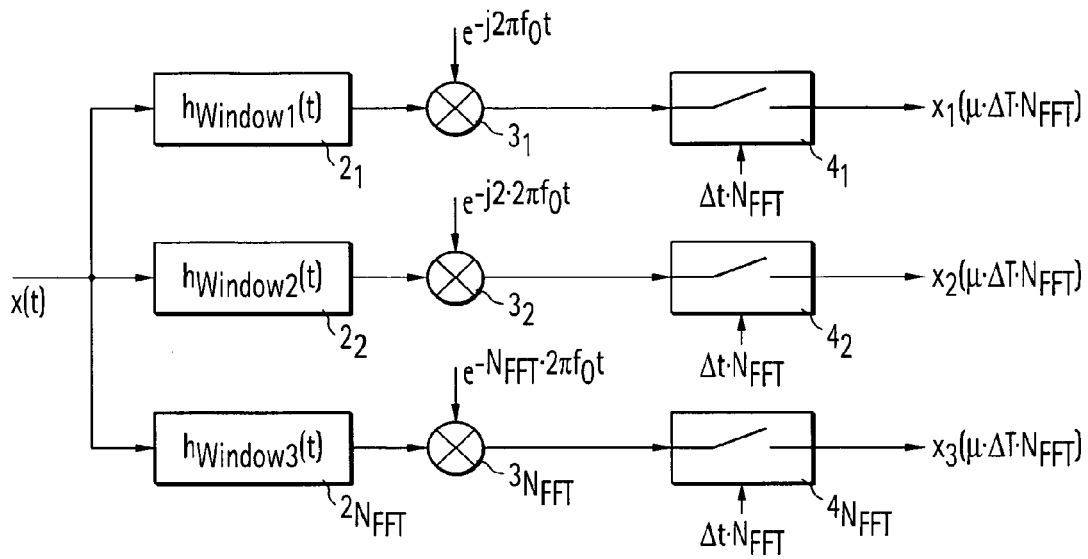
FIG. 3 shows a block diagram of a Fast Fourier Transform filter bank.
Figure 5:
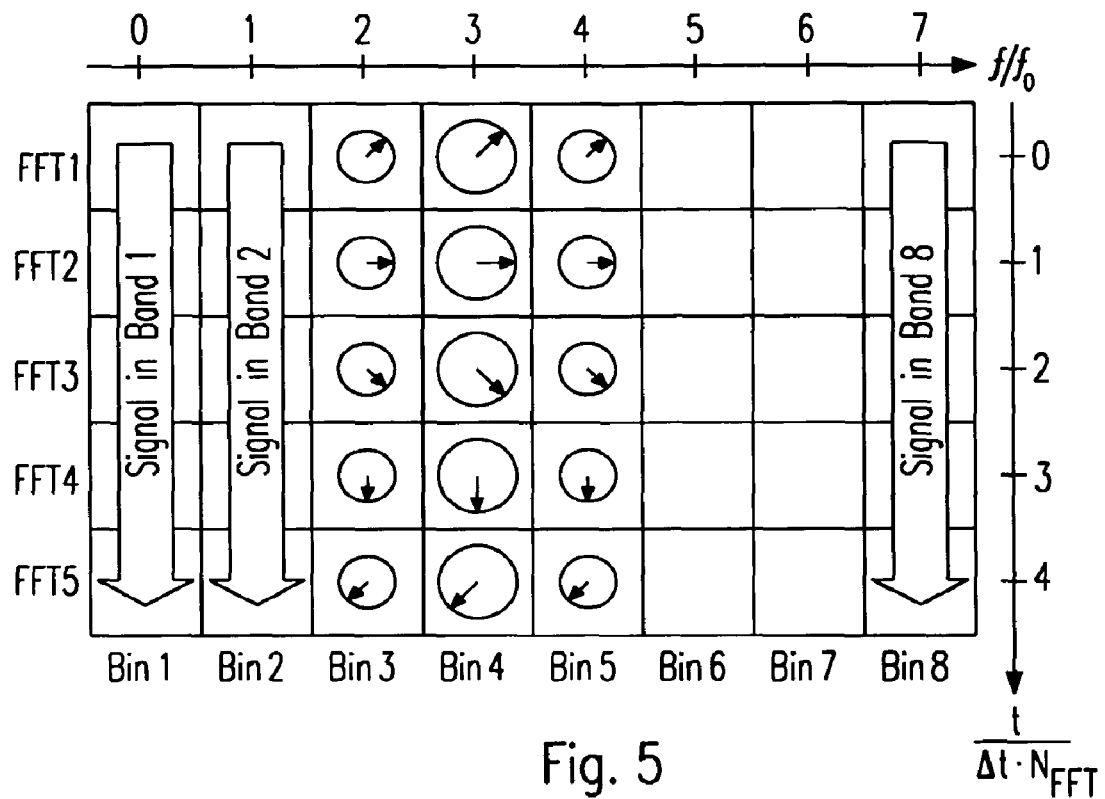
FIG. 5 shows a frequency-time diagram of an application according to the invention of a Fast Fourier Transform filter bank.

By way of summary, the frequency-time diagram of the FFT filter bank in FIG. 5 once again shows the connections between the time domain and the frequency domain with an FFT filter bank according to the invention, which, via several Fast Fourier transformers $FFT_1$, $FFT_2$, $FFT_3$, $FFT_4$ and $FFT_5$, generates a total of $N_{FFT}=8$ frequency bands, which correspond respectively to the individual signal paths of the FFT filter bank in FIG. 3, with a bandwidth at the level of the bin width $f_0$ of the FFTs.

Figure 6:
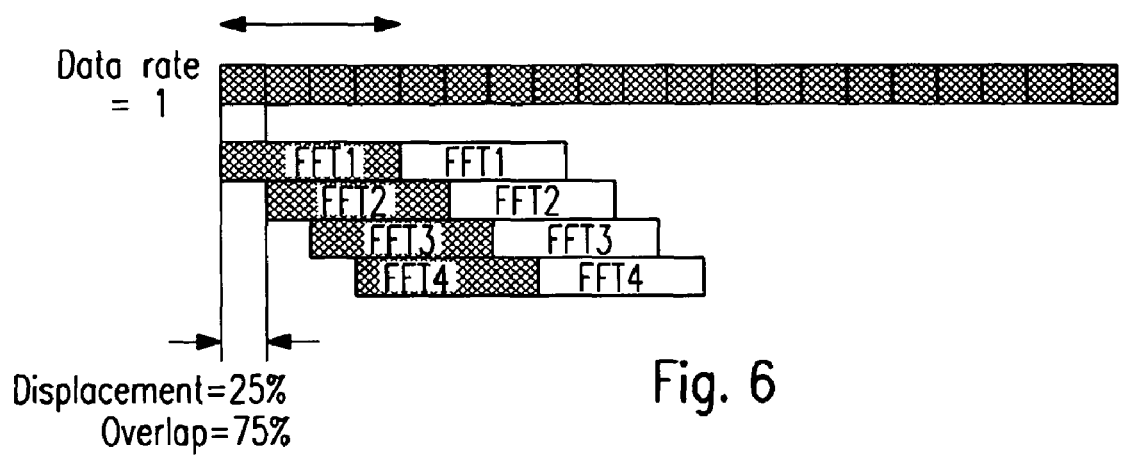
FIG. 6 shows a schematic display of a FFT filter bank consisting of FFTs with a time-overlap.

The individual Fast Fourier transformers $FFT_1$, $FFT_2$, $FFT_3$, $FFT_4$ and $FFT_5$ of the FFT filter bank need not be connected cyclically one after the other, but can also provide a time overlap as shown in FIG. 6. This arrangement corresponds to the Welch method known from the prior art. The respective $N_{FFT}$ sampling values at the outputs of the respective $N_{FFT}$ signal paths of the FFT filter bank 1 are present according to FIG. 3 at the positions $x_1(\mu \cdot \Delta t \cdot N_{FFT} \cdot (1-\text{overlap}))$, $x_2(\mu \cdot \Delta t \cdot N_{FFT} \cdot (1-\text{overlap}))$, ..., $x_{NFFT}(\mu \cdot \Delta t \cdot N_{FFT} \cdot (1-\text{overlap}))$. By comparison with the non-overlapping FFTs, there is therefore an oversampling by the factor $$\frac{1}{1-\text{overlap}}.$$

Additionally, the overlap in the case of a sinusoidal interference signal with a frequency $f_k$, which provides a frequency difference $\Delta f_0$ from the mid-frequency of the FFT bin ($f_k = v \cdot f_0 + \Delta f_0$), brings about a rotating phasor, which provides a faster rotational velocity $$\frac{\Delta f_0}{1-\text{overlap}}.$$

The overlapping of the individual FFT window of the FFT filter bank 1 leads to a correlation between the values of the measured signal. As a result of the overlap, oversampled FFT results are obtained. The overlap factor ov is obtained with an overlap according to equation (5):

$$ov = \frac{1}{1-\text{overlap}} \quad (5)$$

Only FFT results with a difference of ov or more are formed from non-overlapping FFT windows of the FFT filter bank 1. The oversampling is compensated by an undersampling by a factor $$\frac{1}{1-\text{overlap}}$$

in the individual FFTs. In this manner, un-correlated noise sampling values, and therefore also a white noise signal necessary for the eigenvalue analysis of autocorrelation matrices, is provided.

If only an undersampling by the factor $N_{FFT}$ is implemented in the individual undersamplings of the FFTs of the FFT filter bank, as shown in FIG. 3, then a data sequence $x_v(\mu) = x_v(\mu \cdot \Delta t)$ is obtained at the output of the FFTs for the frequency band v as shown in equation (6), wherein $w(\mu)$ models the noise and the summated term models the total of p sinusoidal interference signals:

$$x_v(\mu) = w(\mu) + \sum_{k=1}^{p} A_k \cdot e^{j(\mu \omega_k + \varphi_k)} \quad (6)$$

An undersampling by the factor $N_{FFT}(1-\text{overlap})$ in the individual FFTs of the FFT filter bank 1 leads to a non-oversampled data sequence $x_t(\mu \cdot ov)$ according to equation (7) only for every $ov$-$^{th}$ value:

$$x_v(\mu \cdot ov) = w(\mu \cdot ov) + \sum_{k=1}^{p} A_k \cdot e^{j(\mu \cdot ov \cdot \omega_k + \varphi_k)} \quad (7)$$

According to equation (8), the scaled angular frequency $\omega_{norm,k}$ is the non-oversampled angular frequency $\omega_k$ scaled to the bin width $f_0$ of the FFT filter bank of the spectral line associated with a sinusoidal interference signal and represents the frequency difference $\Delta f_0$ of the spectral line at the frequency $v \cdot f_0$ of the nearest FFT bin, which corresponds to the mid-frequency $v \cdot f_0$ of the respective frequency band.

$$\omega_{norm,k} = ov \cdot \frac{2\pi f_k}{f_0} \quad (8)$$

The scaled angular frequency $\omega_{norm,k}$ therefore provides a value range $[-\pi, +\pi]$. At $\omega_{norm,k} = \pm \pi$, the associated spectral line is disposed exactly at the right-hand or respectively left-hand edge of the respective FFT bin and can also be found with the same strength in the adjacent frequency band.

According to equation (9) the ideal autocorrelation matrix R, which provides, for example, the dimension M×M, is obtained from a non-oversampled output signal $x_v(\mu \cdot ov)$ at the output of the FFT associated with the frequency band v. Sampled values disposed at a past time of the non-oversampled output signal $x_v(\mu \cdot ov)$ are used for this purpose:

$$R = E\{\underline{x} \cdot \underline{x}^+\} \text{ with } \underline{x} = [x(\mu), x(\mu-ov), \ldots, x(\mu-M \cdot ov)]^T \quad (9)$$

The autocorrelation matrix R is a square, positive and definite matrix, that is to say, its eigenvalues are real and positive. The eigenvectors, associated with the non-equal eigenvalues, are also orthogonal.

As a result of the stochastic—noise-laden—character of the non-oversampled output signal $x_t(\mu \cdot ov)$ at the output of the FFT filter bank 1, a reliable estimate for the autocorrelation matrix $\hat{R}_v$ according to equation (10) is determined through multiple averaging—a total of $N_{avg}$ times:

$$\hat{R}_v = \frac{1}{N_{avg}} \sum_{\mu=(M-1)\cdot ov}^{(M-1)\cdot ov+N_{avg}-1} \begin{bmatrix} x(\mu) \\ x(\mu-ov) \\ \vdots \\ x(\mu-(M-1)\cdot ov) \end{bmatrix} \cdot \begin{bmatrix} x^*(\mu), x^*(\mu-ov), \ldots, x^* \\ (\mu-(M-1)\cdot ov) \end{bmatrix} \quad (10)$$

The estimation of the autocorrelation matrix $\hat{R}_v$ for every frequency band can be implemented stepwise during the normal FFT filter bank calculation. Only the most recent $(M-1)\cdot ov+1$ FFT results must be kept in the memory at the output of the FFT filter bank 1. If the FFT filter bank 1 is realised as an online FFT filter bank, the memory is written with a datastream with an arbitrary length of coherent FFT results. By contrast, an offline FFT filter bank is only supplied with a databank of finite length and therefore only writes a given number of FFT results to the memory. While an offline FFT filter bank guarantees an adequate supply of the estimator of autocorrelation matrices with FFT results, for a secure supply of the estimator of autocorrelation matrices with FFT results in the case of an offline FFT filter bank, a data block with a minimum length $N_{Data,min}$ is required at the input of the FFT filter bank 1, as will be shown below.

If the individual FFTs of the FFT filter bank 1 are used according to FIG. 6 with overlapping in the time domain, then each FFT provides a timing offset of a total of $$\frac{N_{FFT}}{ov} = (1-\text{overlap})\cdot N_{FFT}$$

sampling values at the time-offset FFT with an FFT length $N_{FFT}$. Taking into consideration that every FFT for the calculation of a respective FFT result requires a total of $N_{FFT}$ sampling values at the input, with a data block of a total of $N_{Data}$ sampling values at the input according to equation (11), the number $N_{resultsFFT}$ of FFT results generated by an FFT is derived according to equation (11):

$$N_{results,FFT} = \text{nextsmallestinteger}\left\{\left[\frac{N_{Data}}{N_{FFT}}-1\right]\cdot ov\right\}+1 \quad (11)$$

Equation (11) takes into consideration that for the calculation of the first FFT result, a data block with a data length $N_{Data}$ larger than the FFT length $N_{FFT}$ by at least a factor of 1 must be present at the input (factor "−1" in the mathematical term of the square brackets).

Since at least (M) coherent FFT results must be present in the memory at the output of the FFT filter bank 1 for the calculation of an estimate $\hat{R}_v$ of the autocorrelation matrix, a total of $N_{resits,\hat{R}}$ averagings of the estimate $\hat{R}_v$ of the autocorrelation matrix can be implemented according to equation (12) with a total of $N_{resultsFFT}$ FFT results.

$$N_{results,\hat{R}} = \begin{cases} N_{results,FFT}-(M-1)\cdot ov & \text{for } N_{res,FFT} > (M-1)\cdot ov+1 \\ 0 & \text{otherwise} \end{cases} \quad (12)$$

From equations (11) and (12), the minimum length $N_{Data,min}$ of a data block at the input of the FFT filter bank 1 can be determined, in order to provide an estimate $\hat{R}_v$ for the autocorrelation matrix, which is derived according to equation (13):

$$N_{Data,min} = M\cdot N_{FFT} \quad (13)$$

If the data recording of the data block is stopped at the input of the FFT filter bank 1 after at least $N_{Data,min}$ data, the FFT results disposed in the memory at the output of the FFT filter bank 1 should be deleted before resuming the data recording, because exclusively coherent—phase-justified, continuous—FFT results are required for a correct estimation of the autocorrelation matrix.

After a total of $N_{avg}$ averaging stages according to equation (10), the M eigenvalues $\lambda_1, \ldots, \lambda_M$ associated with the estimate $\hat{R}_v$ of the autocorrelation matrix and the associated eigenvectors $\underline{v}_1, \ldots, \underline{v}_M$ of the respective frequency band v are calculated according to the MUSIC (Multiple Signal Classification) method.

The eigenvalues of the autocorrelation matrix can be subdivided into two groups. The first group of the lowest eigenvalues, of which the number M−p is equal to the dimension M of autocorrelation matrix $\hat{R}_v$ reduced by the number p of sinusoidal interference signals present in the frequency band v, are associated with the noise components of the measured signal $x(n\cdot ov)$. The second group of the remaining eigenvalues, which are associated with the signal components—in the present case with the sinusoidal interference signals—and of which the number therefore corresponds to the number p sinusoidal interference signals, each provide a significant value difference relative to each of the respective, lowest eigenvalues associated with the noise components.

No deterministic method exists for separating all eigenvalues $\lambda_1, \ldots, \lambda_M$ of the estimate $\hat{R}_v$ of the autocorrelation matrix associated with the frequency band v into the first and second group of eigenvalues and therefore for the determination of the number p of sinusoidal interference signals in the measured signal $x(n\cdot ov)$. According to the prior art, only a statistical analysis of the eigenvalues by means of histogram can be used in order to separate the eigenvalues $\lambda_1, \ldots \lambda_M$.

With an ideal autocorrelation matrix R, the lowest eigenvalues $\lambda_1, \ldots, \lambda_{M-p}$ associated with the noise components are identical and, according to equation (14), equal to the noise power $\sigma_w^2$.

$$\sigma_w^2 = \lambda_i \text{ für } i \in [1, \ldots, M-p] \quad (14)$$

In the case of a numerically-estimated autocorrelation matrix $\hat{R}_i$, the noise eigenvalues $\lambda_1, \ldots, \lambda_{M-p}$ are distributed about the actual noise power $\sigma_w^2$ as a mean value. In this case, the noise power $\sigma_w^2$ is determined according to equation (15):

$$\sigma_w^2 = \frac{1}{M-p}\sum_{k=1}^{M-p}\lambda_k \quad (15)$$

The variance σ of the noise eigenvalues according to equation (16) declines with an increasing averaging duration $N_{avg}$.

$$\sigma = \sqrt{\frac{1}{k}\sum_{i=1}^{k}|\lambda_i-\mu|^2} \quad (16)$$

The scaled angular frequencies $\omega_{norm,k}$ of the spectral lines associated with the individual sinusoidal interference signals of a frequency band v are determined with the assistance of an estimation function, which is based upon the eigenvalue analysis of autocorrelation matrices. These methods, which form the prior art, are described in detail in Manon H. Hayes: "Statistical digital signal processing and modelling", John Wiley & sons. Inc., 1996, page 451 to 469. The MUSIC (Multiple Signal Classification) method and respectively the Root MUSIC method are presented here briefly, without going into the details, only by way of example.

With the pure MUSIC method, on the basis of the eigenvectors $v_i$ associated with the noise components and an arbitrary column vector $\underline{e}(\omega_{normk})$ of the signal correlation matrix $R_s$ according to equation (17), an estimation function $P_{MU}(e^{j\omega_{normk}})$ according to equation (18) is formed:

$$\underline{e}(\omega_{normk}) = [1, e^{j\omega_{normk}}, e^{j2\omega_{normk}}, \ldots, e^{j(M-1)\omega_{normk}}] \quad (17)$$

$$P_{MU}(e^{j\omega_{normk}}) = \frac{1}{\sum_{i=1}^{M-p} |\underline{e}^+(\omega_{normk}) \cdot \underline{v}_i|^2} \quad (18)$$

As shown in detail in Manon H. Hayes: "Statistical digital signal processing and modelling", John Wiley & sons. Inc., 1996, page 451 to 469, each of the eigenvalues $\underline{v}_i$ associated with the individual noise components is orthogonal to an arbitrary column vector $\underline{e}(\omega_{normk})$ of the signal autocorrelation matrix $R_s$ with a scaled angular frequency $\omega_{norm,k}$ of a sinusoidal interference signal in the non-oversampled output signal $x_i(n \cdot ov)$ at the output of the FFT filter bank 1. In this case, the scalar product $\underline{e}(\omega_{normk}) \cdot \underline{v}_i$ is zero, and accordingly, the estimation function $P_{MU}(e^{j\omega_{normk}})$ is at a maximum. The scaled angular frequencies $\omega_{norm,k}$ at the respective p largest maxima of the estimation function $P_{MU}(e^{j\omega_{normk}})$ therefore represent the scaled angular frequencies $\omega_{norm,k}$ of the sinusoidal interference signals in the non-oversampled output signal $x_i(n \cdot ov)$ at the output of the FFT filter bank 1. In this manner, with the estimation function $P_{MU}(e^{j\omega_{normk}})$, an estimation function for the identification of the scaled angular frequencies $\omega_{norm,k}$ of the sinusoidal interference signals in the non-oversampled output signal $x_i(n \cdot ov)$ is obtained at the output of the FFT filter bank 1.

The calculation of the estimation function $P_{MU}(e^{j\omega_{normk}})$ via the angular frequency $\omega_{norm,k}$, which represents a pseudo spectrum, can be advantageously implemented via an FFT. In this context, the FFT length determines the frequency resolution of the calculated estimation function $P_{MU}(e^{j\omega_{normk}})$.

In the case of the Root MUSIC Method, the Z-transform $V_i(z)$ of the individual eigenvectors $v_i$ respectively associated with the noise components is determined. For this purpose, the individual components $v_i(l)$ of the respective noise eigenvectors $v_i$ are subjected to a Z-transform according to equation (19):

$$V_i(z) = \sum_{l=0}^{M-1} v_i(k) \cdot z^{-l} \text{ for all } i = 1, \ldots, M-p \quad (19)$$

The estimates for the total of p scaled angular frequencies $\omega_{norm,k}$ of the sinusoidal interference signals result from the angles of the p zero points of the polynomial D(z) calculated from the Z-transform $V_i(z)$ according to equation (20), which are disposed nearest on the unit circle of the complex z-plane:

$$D(z) = \sum_{i=1}^{M-p} V_i(z) V_i^*(1/z^*) \quad (20)$$

The scaled angular frequencies $\omega_{normk}$ can only be determined with an accuracy of $2\pi$, both with the pure MUSIC method via the FFT calculation of the pseudo spectrum and also with the Root-MUSIC method using the zero-point search at the unit circle of the complex z-plane, so that, in particular, the scaled angular frequencies $\omega_{normk}$ at the edges of the respective frequency band cannot be identified unambiguously. An unambiguous identification can only be achieved by combining the results determined in the individual frequency bands.

The power levels $P_{MUi,k}$ of the respective p sinusoidal interference signals at the scaled angular frequencies $\omega_{normk}$ of a frequency band $\nu$ are obtained from the solution of the equation system (21), as is also shown in detail in Manon H. Hayes: "Statistical digital signal processing and modelling", John Wiley & sons. Inc., 1996, page 459 to 463, $$\sum_{k=1}^{p} P_{MUi,k} \cdot |V_i(e^{j\omega_{normk}})| = \lambda_i - \sigma_w \text{ for all } i = 1, \ldots, p \quad (21)$$

The Z-transform $V_i(e^{j\omega_{normk}})$ of the eigenvectors $v_i$ associated with the respective p interference signal components are obtained from equation (22) with reference to equation (19) for the M-p noise-component eigenvectors:

$$V_i(e^{j\omega_k}) = \sum_{l=0}^{M-1} v_i(l) e^{-j\omega_{normk} l} \text{ for all } i = 1, \ldots, p \quad (22)$$

The eigenvectors $\lambda_{M-p+1}, \lambda_{M-p+2}, \ldots, \lambda_M$ associated with the p sinusoidal interference signals are the largest eigenvectors, arranged respectively in ascending order, of the estimated value $\hat{R}_\nu$ of the autocorrelation matrix for the frequency band $\nu$. $\sigma_w$ is the noise power predominating in the respective frequency band $\nu$. The vectorial presentation of equation system (21) is derived from equation system (23):

$$\begin{bmatrix} |V_{M-p+1}(e^{j\omega_{norm1}})|^2 & |V_{M-p+1}(e^{j\omega_{norm2}})|^2 & \ldots & |V_{M-p+1}(e^{j\omega_{normp}})|^2 \\ |V_{M-p+2}(e^{j\omega_{norm1}})|^2 & |V_{M-p+2}(e^{j\omega_{norm2}})|^2 & \ldots & |V_{M-p+2}(e^{j\omega_{normp}})|^2 \\ \vdots & \vdots & \ddots & \vdots \\ |V_M(e^{j\omega_{norm1}})|^2 & |V_M(e^{j\omega_{norm2}})|^2 & \ldots & |V_M(e^{j\omega_{normp}})|^2 \end{bmatrix} \quad (23)$$

$$\begin{bmatrix} P_{MU\nu,1} \\ P_{MU\nu,2} \\ \vdots \\ P_{MU\nu,p} \end{bmatrix} = \begin{bmatrix} \lambda_{M-p+1} - \sigma_w^2 \\ \lambda_{M-p+2} - \sigma_w^2 \\ \vdots \\ \lambda_M - \sigma_w^2 \end{bmatrix}$$

After the power level $P_{MUi,k}$ and the scaled angular frequencies $\omega_{normk}$ of the respective p($\nu$) sinusoidal interference signals have been determined for every frequency band $\nu$, for example, using the MUSIC method, as presented above, the results of the individual frequency bands $\nu$ must be combined to form a combined result. In this context, it must be taken into consideration that spectral lines of sinusoidal interference signals are obtained in adjacent frequency bands because of the windowing of the FFT filter bank 1.

The problem of frequency-band-wide superimposition is already known from the prior art in the context of the time overlap of several FFTs (overlapped FFT). The time overlap in this context serves to compensate the non-constant window-transmission function with regard to an approximately constant evaluation of all spectral values in the entire frequency range. According to the prior art, an estimation of the frequency spectrum generated through an FFT filter bank 1 with overlapping in the time domain is realised by means of the Welch method.

As shown in detail in Manon H. Hayes: "Statistical digital signal processing and modelling", John Wiley & sons. Inc., 1996, page 415 to 420, the expected value $E\{\hat{S}_{Welch}(e^{j\omega})\}$ of a frequency spectrum generated from several time-overlapped FFTs according to equation (24) is derived from the convolution of the frequency spectrum $S(e^{j\omega})$ generated through an FFT filter bank 1 with the modulus-squared window transmission function $H(e^{j\omega})$ $$E\{\hat{S}_{Welch}(e^{j\omega})\} = S(e^{j\omega}) * |H(e^{j\omega})|^2 \quad (24)$$

The variance of a frequency spectrum of this kind generated via the Welch method tends toward zero with an increasing averaging length.

The above Welch method is used according to the invention, to achieve an unambiguous identification of main and subsidiary lines within one of the frequency bands ν, which can be assigned to several sinusoidal interference signals with frequencies in different frequency bands. The individual frequency bands are overlapped in the time domain for this purpose as shown in FIG. 6.

The expected value for a frequency spectrum of an FFT filter bank 1 consisting of several spectral lines is derived starting from equation (24) using the Welch method according to equation (25):

$$E\{\hat{S}_{Welch}(e^{j\omega})\} = \sum_k (P_k \cdot \delta(\omega - \omega_k)) * |H(e^{j(\omega)})|^2 \quad (25)$$

$$= \sum_k P_k \cdot |H(e^{j(\omega - \omega_k)})|^2$$

Since the frequency spectrum generated by the FFT filter bank 1 and then modified using the Welch method is only calculated at the discrete frequencies $f_0$ of the FFT bins, the expected value of a frequency spectrum of an FFT filter bank 1 consisting of several spectral lines is obtained according to equation (26):

$$E\{\hat{S}_{Welch}(e^{j\nu 2\pi f_0})\} = \sum_k P_k \cdot |H(e^{j(\nu 2\pi f_0 - 2\pi f_k)})|^2 \quad (26)$$

For the frequencies $f_k$ of the individual spectral lines, the relationship in equation (27) applies, in which the frequency $f_k$ of the spectral line is classified in the FFT frequency grid by specifying the frequency offset $\Delta f_0$ relative to the nearest FFT bin.

$$f_k = \nu \cdot f_0 + \Delta f_{0k} = \nu \cdot f_0 + \frac{\omega_{norm}}{2\pi} f_0 \quad (27)$$

Accordingly, for every scaled angular frequency $\omega_{normk}$, there is an individual expected value $\hat{S}_{Welch}(e^{j\nu 2\pi f_0})$ for the frequency spectrum at the discrete frequency $f_0$ of the FFT bin in the frequency band ν.

Accordingly, the power level $P_{MU\nu}$, determined, for example, by means of the MUSIC method, of a spectral line at the scaled angular frequency $\omega_{normk}$ in the frequency band ν is derived according to equation (28) as the expected value $\hat{S}_{Welch}(e^{j\nu 2\pi f_0})$ for the frequency spectrum, which is calculated from the sum of all respective power levels $P_k$ multiplicatively linked with the modulus-squared, window transmission function frequency-displaced by the frequency $f_k$ with approximately identical scaled angular frequency $\omega_{normk}$ and accordingly identical frequency offset $\Delta f_0$ relative to the respective FFT bin frequency:

$$P_{MU\nu} = E\{\hat{S}_{Welch}(e^{j\nu 2\pi f_0})\} = \sum_k P_k \cdot |H(e^{j(\nu 2\pi f_0 - 2\pi f_k)})|^2 \quad (28)$$

All spectral lines, of which the scaled angular frequencies $\omega_{normk}$ provide an angular-frequency difference $\Delta \omega_{normk}$ according to equation (29), which is smaller than a maximum angular-frequency difference $\Delta \omega_{normMax}$, are counted as spectral lines in different frequency bands ν with approximately identical scaled angular frequency $\omega_{normk}$.

$$\Delta \omega_{normk} < \Delta \omega_{normMax} << \pi \quad (29)$$

Figure 7:
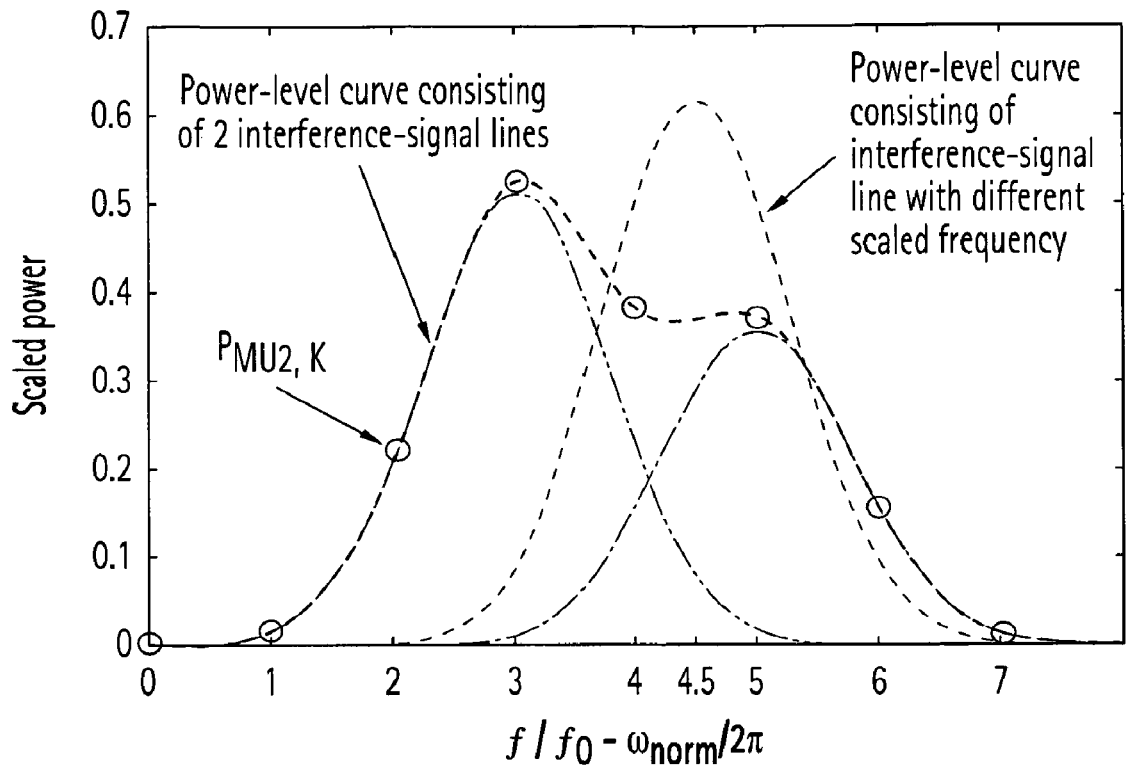
FIG. 7 shows a spectral display of power-level curves.

The power levels $P_{MU\nu}$ at the individual FFT bin frequencies $\nu \cdot f_0$ which can be calculated for each given scaled angular frequency $\omega_{normk}$ according to equation (28), are obtained in sum for each given scaled angular frequency $\omega_{normk}$ in a power-level curve according to FIG. 7.

The number p(ν) of sinusoidal interference signals, the scaled frequencies $\omega_{normk}$ and the power levels $P_{MU\nu}$ of the respective spectral lines associated with the p(ν) sinusoidal interference signals are derived using the MUSIC method and the subsequent Welch method for each frequency band ν. Ambiguity continues to exist with regard to the frequencies $f_k$ and the power level $P_k$ of those spectral lines, which contribute to the power-level curve with approximately identical scaled angular frequency $\omega_{normk}$ in adjacent frequency bands ν at the respective FFT bin frequency $\nu \cdot f_0$.

For the determination presented below of the individual power levels $P_k$ of those spectral lines, which contribute to the power-level curve with approximately identical scaled angular frequency $\omega_{normk}$ in adjacent frequency bands ν at the respective FFT bin frequency $\nu \cdot f_0$, a weighted, scaled angular frequency $\overline{\omega}_{normk}$ according to equation (30) is introduced in the individual frequency bands ν instead of the scaled angular frequency $\omega_{normk}$:

$$\overline{\omega}_{normk} = \sphericalangle \sum_\nu P_{MU\nu} \cdot e^{j\omega_{normk\nu}} \quad (30)$$

By taking into consideration the power levels $P_{MU\nu}$ in the weighted, scaled angular frequency $\overline{\omega}_{normk}$, the scaled angular frequencies $\omega_{normk\nu}$ of spectral lines, which provide a higher power level $P_{MU\nu}$, are more heavily weighted. Through the use of the complex exponential function $e^{j\omega_{normk\nu}}$ for the scaled angular frequency $\omega_{norm\nu}$, in particular, at the frequency band edges ($\omega_{normkv}=\pm\pi$), the value of the scaled angular frequency $\omega_{normkv}$ is preserved in the averaging.

Starting from equation (28), the relationship between the power levels $P_{MUv}$ determined, for example, using the MUSIC method in the frequency band v at a given weighted, scaled angular frequency $\overline{\omega}_{normk}$ and the linear combination of the sought power levels $\hat{P}_k$ of spectral lines, which result from sinusoidal interference signals with angular frequencies $\omega_k$ in adjacent frequency bands v±i and which are superimposed at the power level $P_{MUv}$ of the power-level curve in the frequency band v, is described by the equation system (31). The angular frequencies $\omega_k$ of the main lines and subsidiary lines associated respectively with a sinusoidal interference signal, which are associated in sum with a common power-level curve, are disposed respectively in adjacent frequency bands v±i and all provide the identical frequency difference $\Delta f_0$ at the respective frequency band mid-frequency or respective FFT bin frequency (v±i)·$f_0$. The power-level curves begin respectively in the frequency band $n_{Start}$ and extend over a total of $N_{LP}$ frequency bands. In the equation system (31), it is assumed that a main line of a sinusoidal interference signal could be disposed in each of the total of $N_{LP}$ frequency bands.

In a first plausibility test, all of the power-level values $\hat{P}_k$ determined according to equation (33) or (34) are checked with reference to a noise power threshold $thres_{noise}$. For further processing, only power-level values $\hat{P}_k$ are accepted, which are disposed above the noise power $\sigma_{w,n}^2$ of the respective frequency by the factor $thres_{noise}$ and which therefore provide a minimum difference in the spectral line level relative to the noise level.

In a second, subsequent plausibility test, all power-level values $\hat{P}_k$ are tested with reference to a dynamic threshold $thres_{dynamic}$. In this context, all power-level values $\hat{P}_k$, which are disposed below the maximum spur power max($\hat{p}$) of the respective power-level curve by the factor $thres_{dynamic}$, are discarded.

The frequency $f_k$ of the spectral line found, for example, by means of the MUSIC algorithm, is determined according to equation (35) from the number $V_{Bin}$ of the associated frequency band (counted from 1 to $N_{FFT}$) with the addition of the weighted, scaled angular frequency $\overline{\omega}_{normk}$.

$$\begin{bmatrix} |H(\overline{\omega}_{normk} \cdot f_0)|^2 & |H(-2\pi f_0 + \overline{\omega}_{normk} \cdot f_0)|^2 & \dots & |H(-(N_{LP}-1)2\pi f_0 + \overline{\omega}_{normk} \cdot f_0)|^2 \\ |H(2\pi f_0 + \overline{\omega}_{normk} \cdot f_0)|^2 & |H(\overline{\omega}_{normk} \cdot f_0)|^2 & \dots & |H(-(N_{LP}-2)2\pi f_0 + \overline{\omega}_{normk} \cdot f_0)|^2 \\ \vdots & \vdots & \ddots & \vdots \\ |H((N_{LP}-1)2\pi f_0 + \overline{\omega}_{normk} \cdot f_0)|^2 & |H((N_{LP}-2)2\pi f_0 + \overline{\omega}_{normk} \cdot f_0)|^2 & \dots & |H(\overline{\omega}_{normk} \cdot f_0)|^2 \end{bmatrix} \quad (31)$$

$$\cdot \begin{bmatrix} \hat{P}_{n_{start}} \\ \hat{P}_{n_{start}+1} \\ \vdots \\ \hat{P}_{n_{start}+N_{LP}-1} \end{bmatrix} = \begin{bmatrix} P_{MU,n_{start}} \\ P_{MU,n_{start}+1} \\ \vdots \\ P_{MU,n_{start}+N_{LP}-1} \end{bmatrix} + \begin{bmatrix} e_{n_{start}} \\ e_{n_{start}+1} \\ \vdots \\ e_{n_{start}+N_{LP}-1} \end{bmatrix}$$

The equation system (31) can be presented in an equivalent manner via the short form of equation (32).

$$H \cdot \underline{\hat{P}} = \underline{P}_{MU} + \underline{e} \quad (32)$$

The error vector $\underline{e} = [e_{n_{start}}, e_{n_{start}+1}, \dots, e_{n_{start}+N_{LP}-1}]^T$ represents the error of the MUSIC algorithm in the respective power-level curve. If the error vector $\underline{e}$ is set to zero, then an unambiguous solution is obtained for the estimated vector $\underline{\hat{P}}$ of the sought power level $P_k$ according to equation (33):

$$\underline{\hat{P}} = H^{-1} \cdot \underline{P}_{MU} \quad (33)$$

Through the error vector $\underline{e}$, error power-level values $\hat{P}_k$ can occur, some of which can also be negative. In a case of this kind, by resolving the optimisation problem according to equation (34), which guarantees a non-negative estimated vector $\underline{\hat{P}}$ for the sought power-level values $P_k$, a better solution can be achieved than by resolving the equation system (33).

$$\min_{\hat{p}} \| H \cdot \underline{\hat{P}} - \underline{P}_{MU} \|^2 \text{ under subsidiary condition } \hat{p} > 0 \quad (34)$$

Since the calculation of the sought estimated value $\underline{\hat{P}}$ of the power level vector can lead to erroneous power-level values $\hat{P}_k$ using the optimisation method according to equation (34) and also using the equation system (33), an additional plausibility test is provided according to the invention for each individual power-level value $\hat{P}_k$.

$$f_k = \left( (v_{Bin} - 1) + \frac{\overline{\omega}_{normk}}{2\pi} \right) \cdot f_0 \quad (35)$$

If only one sideband—in the case of a real measured signal x(t)—is evaluated, then the respectively-determined power-level value $\hat{P}_k$ must still be multiplied by the factor 2.

The removal according to the invention of the identified spectral lines associated with the sinusoidal interference signals is implemented after all of the main lines and subsidiary lines, associated with all of the sinusoidal interference signals present in the noise signal have been identified and found to be essential for the further signal processing according to the first and second plausibility tests. Alternatively, spectral lines, of which the frequencies are known, for example, in the case of the disturbance of the noise signal by system hum, can also be removed without the identification according to the invention described above using the method according to the invention for the removal of sinusoidal interference signals from a noise signal.

The starting point is a list with frequencies $f_k$, at which sinusoidal interference signals occur. The removal of the spectral lines associated with the sinusoidal interference signals takes place, once again, by analogy with the detection of interference-signal spectral lines, in several frequency bands generated by an FFT filter bank 1'. The list can contain positive frequencies $f_k$ associated with real sinusoidal interference signals or positive and negative frequencies $f_k$ associated with complex interference-signal rotating phasors. For reasons of simplicity, the removal of real interference signals will be considered below.

After determining the number $L_H$ of frequency bands or respectively FFT bins, which are covered by a window function $|H(f)|^2$ (corresponding, for example, to the frequency range, in which the window function $|H(f)|^2$ exceeds a given threshold value), the variables $p(v=1, \ldots, N_{FFT}/2)$, which count the number of interference-signal spectral lines per frequency band $v$, are initialised—in the case of the observation of one sideband—with the value zero for every frequency band 1 up to $N_{FFT}/2$.

For every frequency $f_k$, at which a spectral line can occur, a test of the Nyquist criterion is carried out as a selection criterion. If the frequency $f_k$ does not satisfy the Nyquist criterion (condition in equation (36)), then the frequency $f_k$ is discarded and no longer pursued.

$$f_k > f_s/2 = 1/(\Delta t \cdot 2) \tag{36}$$

Following this, the number $v_{center}$ of the FFT bin or the respective frequency band according to equation (37), in which the main line of the sinusoidal interference signal with the frequency $f_k$, is disposed, is determined:

$$v_{center} = \text{round}\left(\frac{f_k}{f_s} \cdot N_{FFT}\right) + 1 \tag{37}$$

Starting from the determined number $v_{center}$ of the FFT bins or the respective frequency band, in which the main line of the sinusoidal interference signal with the frequency $f_k$ falls, the counting variables $p(v)$ of those frequency bands according to equation (38), which are disposed within the window function in the frequency range, are incremented.

$$p(v) = p(v) + 1 \tag{38}$$
$$\text{for all } v = v_{center} - \frac{L_H - 1}{2}, \ldots, v_{center} + \frac{L_H - 1}{2}$$

If the list with frequencies $f_k$, at which sinusoidal interference signals occur, contains an estimate for the difference of the power-level value $\hat{P}_k$ of the spectral line of the noise level associated with the sinusoidal interference signal in addition to the frequencies $f_k$, the number $L_H$ of the frequency bands or respectively FFT bins for those spectral lines, of which the power levels $\hat{P}_k$ are disposed only slightly above the noise level, could be reduced in order to cut down the calculation time.

When considering both sidebands or one respective sideband, the estimate $\hat{R}_v$ of the autocorrelation matrix associated with the frequency band $v$ is determined for each of the total of $N_{FFT}$ or respectively $N_{FFT}/2$ frequency bands, starting from the time-discrete output signal $x_v(\mu \cdot ov)$ of the FFT filter bank 1' associated with the respective frequency band $v$. According to equation (39), the dimension $M(v)$ of the estimate $\hat{R}_v$ of the autocorrelation matrix associated with the frequency band $v$ must correspond at least to the number $p(v)$, determined above, of spectral lines per frequency band $v$ or, according to equation (40), must be interpreted as larger than the maximum number $\max(p(v))$ determined over all frequency bands $v$ of spectral lines per frequency band:

$$M(v) > p(v) \tag{39}$$

$$M(v) > \max(p(v)) \tag{40}$$

While the dimensioning according to equation (39) reduces the calculation time and, at the same time, increases the administrative complexity, the dimensioning according to equation (40) allows greater flexibility to expand the list of spectral lines to be removed without the need for a new input of data.

In this manner, the dimension $M(v)$ of the estimate $\hat{R}_v$ of the autocorrelation matrix associated with a frequency band $v$ for the method according to the invention for the removal of sinusoidal interference signals from a noise signal can generally be interpreted as smaller than for the method according to the invention for the detection of sinusoidal interference signals in a noise signal. Moreover, the averaging lengths $N_{avg}$, in the case of the determination of the estimate $\hat{R}_v$ of the autocorrelation matrix associated with a frequency band $v$, can be designed to be smaller for the removal of spectral lines by comparison with the detection of spectral lines.

The determination of the estimate $\hat{R}_v$ of the autocorrelation matrix associated with the frequency band $v$ for the method according to the invention for the removal of spectral lines corresponds to the procedure in the method according to the invention for the identification of spectral lines according to equation (10). In the case of the method according to the invention for identification, the determination of the estimate $\hat{R}_v$ of the autocorrelation matrix associated with the frequency band $v$ is concluded after a total of $N_{avg}$ averagings and, in the case of the method according to the invention for removal, is implemented continuously. The removal of the spectral lines can begin after the presence of a single estimate $\hat{R}_v$ of the autocorrelation matrix associated with the frequency band $v$. The accuracy of the estimate can be improved with an increasing averaging length $N_{avg}$ of the estimate $\hat{R}_v$ of the autocorrelation matrix associated with the frequency band $v$.

Starting from the estimate $\hat{R}_v$ of the autocorrelation matrix associated with the respective frequency band $v$, the noise power $\sigma_{w,v}$ associated with the frequency band $v$ is then determined.

If no spectral line is present within the frequency band $-p(v)=0$, then the noise-power spectrum $\hat{S}(v)$ is derived from the averaging of the spur elements of the estimate $\hat{R}_v$ of the autocorrelation matrix associated with a frequency band $v$ according to the equation (41):

$$\hat{S}(v) = \sigma_{w,v}^2 = \frac{1}{M}\sum_{k=1}^{M}\hat{R}_v(k,k) \tag{41}$$

This corresponds to the Welch method for spectral estimation known from the prior art.

With at least one spectral line per frequency band $v-p(v)>0$—the total of M eigenvalues $\lambda_1, \ldots, \lambda_M$ of the M-dimensional estimate $\hat{R}_v$ of the autocorrelation matrix associated with a frequency band $v$ is sorted via an analysis of eigenvalues of $\hat{R}_v$ and in ascending order of their value $-\lambda_1 \leq \lambda_2 \leq \ldots \leq \lambda_M$. According to equation (42), the noise-power spectrum $\hat{S}(v)$ is once again derived with reference to equation (15) from the averaging of the M-p(v) lowest eigenvalues $\lambda_1 \leq \lambda_2 \leq \ldots \leq \lambda_{M-p(v)}$ of the estimate $\hat{R}_v$ of the autocorrelation matrix associated with the frequency band $v$, which correspond to the noise eigenvalues of the matrix $\hat{R}_v$:

$$\hat{S}(v) = \sigma_{w,v}^2 = \frac{1}{M - p(v)} \sum_{k=1}^{M-p(v)} \lambda_k \quad (42)$$

If a spectral line is erroneously assumed in the frequency band v, in the calculation of the noise-power spectrum $\hat{S}(v)$, with reference to equation (42), the largest noise eigenvalue $\lambda_{M-p_{korrekt}(v)}$ is not taken into consideration in the averaging according to equation (43):

$$\hat{S}(v)|_{p_{incorrect}(v)=p_{correct}(v)+1} = \sigma_{w,v}^2 \quad (43)$$
$$= \frac{1}{M - (p_{correct}(v) + 1)} \sum_{k=1}^{M-(p_{correct}(v)+1)} \lambda_k$$

In equation (43), the mean value of the noise eigenvalues is calculated too low, so that the expected value of the noise-power spectrum $\hat{S}(v)$ loses its unbiased quality. The variance $\sigma_{w,v}$ of the noise eigenvalues according to equation (16) and therefore the variance $\sigma_{w,v}$ of the noise-power spectrum $\hat{S}(v)$, however, tends towards zero with an increasing averaging length $N_{avg}$ of the estimate $\hat{R}_v$ of the autocorrelation matrix associated with the frequency band v, so that, with an increasing averaging length $N_{avg}$, a consistent noise-power spectrum $\hat{S}(v)$ is realised. By increasing the dimension M of the estimate $\hat{R}_v$ of the autocorrelation matrix associated with the frequency band v, more noise eigenvalues are available, which increases the unbiased quality of the noise-power spectrum $\hat{S}(v)$. The calculation of the noise-power spectrum $\hat{S}(v)$ described above is therefore error-tolerant with regard to error entries in the list of sinusoidal interference signals to be removed at the frequencies $f_k$.

In spectrum analysers and network analysers, the subdivision of the entire spectrum generally takes place in several half-decades, in which respectively an optimum, matched sampling frequency $f_S=1/\Delta t$ is used (frequency resolution is indirectly proportional to the average frequency of the respective half-decade). On the basis of the Nyquist criterion, a sampling frequency $f_S=1/\Delta t$ is selected, which is higher than the uppermost threshold frequency of the half-decade, so that the FFT values generated by the respective FFT cover a larger frequency range than the frequency range of the half-decade.

The analysis of the frequency spectrum into several frequency bands by means of FFT filter bank 1 or respectively 1' in the method according to the invention for the identification and respectively removal of sinusoidal interference signals in or from the noise signal can, in this context, be arranged in such a manner that several frequency bands are integrated within one half-decade.

Figure 8:
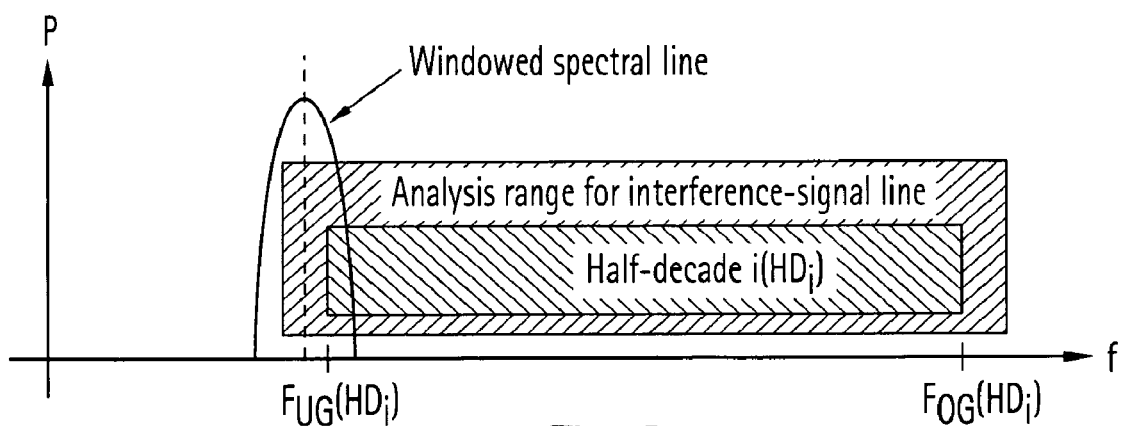
FIG. 8 shows a spectral display of the analysis range for interference-signal spectral lines at half-decade thresholds.

In particular, for frequency bands, of which the frequency-band threshold comes to be disposed within the range of the threshold of the half-decade, it is meaningful to exploit the possibility named above of covering the half-decade through the frequency band, which is generated by the FFT positioned at the edge of the half-decade, to the extent that the frequency band generated by the FFT extends into the adjacent half-decade by a total of $(L_H-1)/2$ bins. In this manner, it is possible, to process correctly subsidiary lines occurring in one half-decade as a result of the windowing of sinusoidal interference signals, of which the frequency $f_k$ according to FIG. 8 is disposed in the adjacent half-decade.

For the identification and removal according to the invention of sinusoidal interference signals from a noise signal with a subdivision of the entire frequency spectrum into several half-decades and into one or more frequency bands per half-decade, the procedure according to the invention is as follows:

For the identification according to the invention as shown in equation (44), those spectral lines, of which the frequencies $f_{ki}$ are disposed within the upper and lower threshold $f_{uG}$ ($HD_i$) and $f_{oG}(HD_i)$ of the respective half-decade i($HD_i$), are entered in each list associated respectively with one half-decade of sinusoidal interference signals to be removed.

$$f_{uG}(HD_i) \leq f_{ki} < f_{oG}(HD_i) \quad (44)$$

For the removal according to the invention, as shown in equation (45), those spectral lines, of which the frequencies $f_{ki}$ are disposed within a frequency range, which is expanded at the upper and lower threshold $f_{uG}(HD_i)$ and $f_{oG}(HD_i)$ of the respective half-decade i ($HD_i$) respectively by the frequency offset $$\frac{L_H - 1}{2} \cdot f_0,$$

are removed from each list associated with one half-decade of sinusoidal interference signals to be removed.

$$f_{uG}(HD_i) - \frac{L_H - 1}{2} \cdot f_0 \leq f_{ki} < f_{oG}(HD_i) + \frac{L_H - 1}{2} \cdot f_0 \quad (45)$$

The stretching of the frequency range of the half-decade to be observed in the removal of spectral lines respectively by the frequency offset $$\frac{L_H - 1}{2} \cdot f_0$$

takes into consideration the subsidiary lines generated through the windowing within the range of the frequency offset of a sinusoidal interference signal, of which the frequency $f_k$ is disposed in the proximity of the half-decade threshold.

If a spectral line is disposed in the proximity of a half-decade threshold, it can be detected dependent upon the measuring inaccuracy in the two adjacent half-decades. In the final list of sinusoidal interference signals to be removed, this case is taken into consideration according to condition (46), by initially selecting from the quantity of all identified spectral lines, all of those spectral-line pairs, of which the frequencies $f_k$ and $f_{k+1}$ are directly adjacent and which are additionally assigned to respectively adjacent half-decades i ($HD_i$) and i+1 ($HD_{i+1}$)

$$f_k \in HD_i \wedge f_{k+1} \in HD_{i+1}. \quad (46)$$

In a second selection stage, all of the spectral-line pairs selected according to condition (46), which are at narrow intervals with reference to their frequency and of which the frequency difference $f_{k+1}-f_k$ according to condition (47) is therefore smaller than a specified maximum frequency difference, are selected.

$$(f_{k+1} - f_k) < \frac{\Delta\omega_{norm,max}}{2\pi} \cdot f_0 \qquad (47)$$

Values, which are suitable for the half-decade i ($HD_i$) with a higher frequency resolution, are used for the maximum, scaled angular frequency difference $\Delta\omega_{normMax}$ and the FFT bin frequency $f_0$ in equation (43).

Of the spectral-line pairs selected according to condition (47), the entry of the spectral line at the frequency $f_{k+1}$ in the half-decade i+1 ($HD_{i+1}$) with the generally lower frequency resolution is deleted from the list of sinusoidal interference signals to be removed.

On the basis of the mathematical background described above, the two methods and systems according to the invention for the identification of sinusoidal interference signals in a noise signal and for the removal of sinusoidal interference signals from a noise signal are described below.

Figure 9:
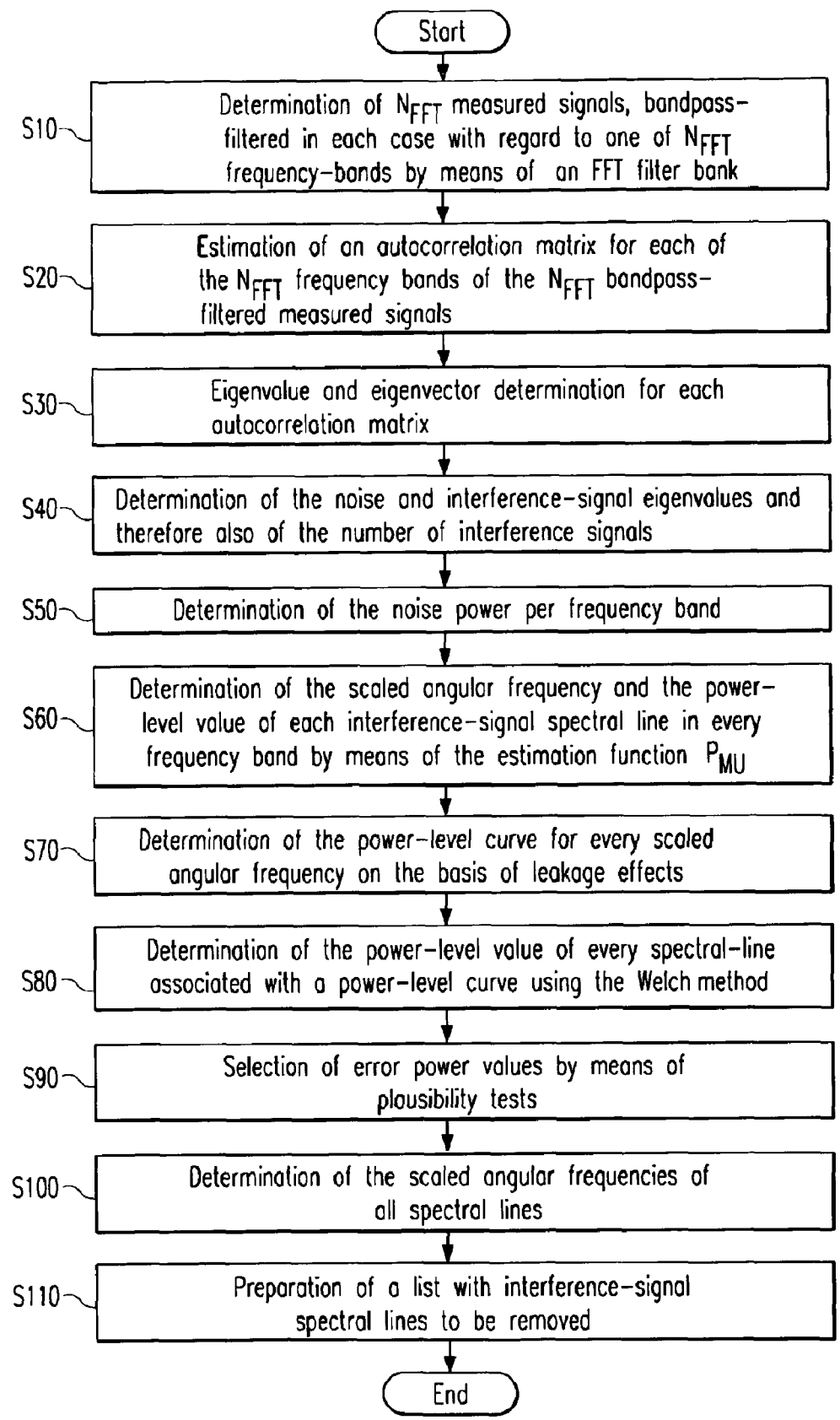
FIG. 9 shows a flow chart for a method according to the invention for the detection of sinusoidal interference signals in a noise signal.

In procedural stage S10 of the method according to the invention for the identification of sinusoidal interference signals according to FIG. 9, starting from a continuous or respectively time-discrete measured signal x(t) or x(λ·Δt), which represents a noise signal w(t) or w(μ·Δt) with superimposed sinusoidal interference signals $A_k \cdot e^{j(\omega_k t + \phi_k)}$ or $A_k \cdot e^{j(\mu \cdot \omega_k \Delta t + \phi_k)}$, a total of $N_{FFT}$ measured signals are generated according to equation (1) by means of an FFT filter bank 1, of which the frequency spectrum is bandpass-filtered to each frequency band v. Each of these measured signals at the output of the FFT filter bank 1 is generated respectively by one FFT of the FFT filter bank 1, wherein the respective bandpass-filtering of the measured signal is implemented via a windowing $2_1$, $2_2$, ..., $2_{NFFT}$ and subsequent down mixing $3_1$, $3_2$, ..., $3_{NFFT}$ via the FFT. The individual FFTs of the FFT filter bank 1 read in the respective measured signal at the input of the FFT filter bank 1 with a time offset and therefore operate with a time overlap with reference to the measured signal at the input. The oversampling of the individual FFT results caused because of this time overlap of the individual FFTs according to equation (7) is compensated by a complementary undersampling in subsequent undersamplings $4_1$, $4_2$, ..., $4_{NFFT}$. In order to generate a total of $N_{FFT}$ measured signals of a given frequency band v, respectively bandpass-filtered with regard to their frequency spectrum, at the output of the FFT filter bank 1, the bandwidth of the output signal of the individual FFTs is limited respectively to one FFT bin length $f_0$.

In the next procedural stage S20, starting from a total of $N_{FFT}$ measured signals, respectively bandpass-filtered with reference to their frequency spectrum to a given frequency band v, an estimate $\hat{R}_v$ of the autocorrelation matrix associated with each frequency band v is determined according to equation (10). As a result of the stochastic characteristic of the noise signal, in this context, the unbiased quality of the estimate $\hat{R}_v$ of the respective autocorrelation matrix is increased by multiple averaging.

The next procedural stage S30 comprises the determination of the eigenvalues $\lambda_1, ..., \lambda_M$ and the associated eigenvectors $v_1, ..., v_M$ of each of the total of $N_{FFT}$ estimates $\hat{R}_v$ of the autocorrelation matrix associated with each frequency band v, which is implemented according to known mathematical methods for eigenvalue analysis of matrices and the determination of corresponding eigenvectors based upon these methods.

In the next procedural stage S40, for every frequency band v and accordingly for the estimate $\hat{R}_v$ of the autocorrelation matrix associated with each frequency band v, a subdivision of all respectively determined eigenvalues $\lambda_1, ..., \lambda_M$ into a first group of eigenvalues $\lambda_1, ..., \lambda_{M-p(v)-1}$ associated with the noise components and into a second group of eigenvalues $\lambda_{M-p(v)}, ..., \lambda_M$ associated with the sinusoidal interference signal components is implemented. This procedural stage S40 contains a subroutine according to the invention, which is described in greater detail below with reference to FIG. 10. With the number of noise eigenvalues $\lambda_1, ..., \lambda_{M-p(v)-1}$ and the number of interference-signal eigenvalues $\lambda_{M-p(v)}, ..., \lambda_M$, the number p(v) of sinusoidal interference signals per frequency band v is determined from procedural stage S40.

In the next procedural stage S50, the noise power $\sigma_{w,v}$ of each frequency band v is calculated according to equation (15) with the determined noise eigenvalues.

In the next procedural stage S60, the scaled angular frequencies $\omega_{normk}$ of the sinusoidal interference signals disposed in the respective frequency band v are determined by determining an estimation function $P_v$ associated with the respective frequency band v, which is based upon the eigenvalues and eigenvectors of the estimate $\hat{R}_v$ of the autocorrelation matrix associated with the respective frequency band v, and by evaluation of this estimation function $P_v$. The MUSIC (Multiple Signal Classification) estimation function $P_{MU,v}$ presented in equation (18) can be used, by way of example, as the estimation function $P_v$. Alternatively, other estimation methods based upon the eigenvalue analysis of autocorrelation matrices can also be used. According to equation (18), the MUSIC estimation function $P_{MU,v}$ provides maxima at those angular frequencies $\omega_{normk}$, at which respectively an eigenvector $v_i$ associated with a noise component is orthogonal to a arbitrary column vector $e_i$ of the signal autocorrelation matrix $R_s$ and at which, accordingly, the scalar product in the denominator expression comprising respectively an eigenvector $v_i$ associated with a noise component and a arbitrary column vector $e_i$ of the signal autocorrelation matrix $R_s$ is zero. The scaled angular frequencies $\omega_{normk}$ of the sought sinusoidal interference signals are derived from the scaled angular frequencies $\omega_{normk}$ of the largest maxima of the estimation function $P_{MU,v}$ corresponding to the number of interference-signal eigenvalues $\lambda_{M-p(v)}, ..., \lambda_M$.

In procedural stage S60, the determination of the power-level values $P_{MU,v,k}$ associated with the individual sinusoidal interference signals for each frequency band v is additionally implemented by resolving the linear equation systems (21) and respectively (23). For this purpose, the respective noise power $\sigma_{w,v}$, all of the interference-signal eigenvalues and the Z-transform $V_i(e^{j\omega_{normk}})$ of the eigenvectors $\lambda_{M-p(v)+1}, ..., \lambda_M$ obtained from the individual interference-signal eigenvalues $v_{M-p(v)+1}, ..., v_M$ are required for each frequency band v, wherein the individual Z-transforms $V_i(e^{j\omega_{normk}})$ calculated at the individual scaled angular frequencies $\omega_{normk}$ of the sinusoidal interference signals are obtained through the estimation function $P_{MU,v,k}$.

In the next procedural stage S70, all of the spectral lines with their respective power-level values $P_{MU,v,k}$, which were identified in the previous procedural stage S60 in the individual frequency bands v at an approximately identical, scaled angular frequency $\omega_{normk}$, are combined to form a combined power-level curve according to FIG. 7. The difference $\Delta\omega_{normk}$ between the two scaled angular frequencies, which, according to condition (29), must be smaller than a specified maximum angular-frequency difference $\Delta\omega_{normkMAx}$, is used as the criterion for approximately-equal angular frequencies $\omega_{normk}$ of spectral lines. For every scaled angular frequency $\omega_{normk}$, the respective power-level curve is derived from the power-level values $P_{MU,v,k}$ localised at the individual FFT bin frequencies $f_0$, respectively assigned to the individual frequency bands v.

The spectral lines respectively identified at a given scaled angular frequency $\omega_{normk}$ in the individual frequency bands $\nu$ in procedural stage S60 can be derived respectively from a superimposition of several spectral lines. This superimposition can result from main lines and subsidiary lines of one or more sinusoidal interference signals, of which the frequency is disposed in a frequency band $\nu$, and at least one subsidiary line of at least one further sinusoidal interference signal, of which the frequencies are disposed in frequency bands $\nu\pm i$ adjacent to the frequency band $\nu$ and which come to be disposed in the frequency band $\nu$ as a result of the leakage effect.

In procedural stage S80, the power-level values $\hat{P}_k$ of the individual spectral lines, which result from sinusoidal interference signals with frequencies in different frequency bands $\nu\pm i$, are determined by resolving the linear equation systems (28) and (31). The power-level values $P_{MU,\nu,k}$ disposed in the preceding procedural stage S70 at the individual FFT bin frequencies $\nu \cdot f_0$ of the spectral lines of the respective sinusoidal interference signals, determined in procedural stage S60, for example, using the MUSIC method, and the modulus-squared window transmission functions $|H(f)|^2$ frequency-displaced by the individual FFT bin frequencies $\nu \cdot f_0$ of the FFT filter bank 1 are entered in the linear equation systems (28) and (31), applicable for a respectively scaled angular frequency $\omega_{normk}$. Ignoring an error vector integrated in the equation systems (28) and (31), which model the process error achieved with the MUSIC method, the individual power-level values $\hat{P}_k$ of the individual spectral lines are calculated by inversion of the matrix H formed with the individual window-transmission functions $|H(f)|^2$ and subsequent multiplication by the vector $\underline{P}_{MU,\nu}$ from the power-level values $P_{MU,\nu,k}$ determined by means of the MUSIC method in the individual frequency bands $\nu$ according to equation (33). Alternatively, the individual power-level values $\hat{P}_k$ of the individual spectral lines can also be determined by minimising the error vector $\underline{e}$ within the context of a minimisation method according to equation (34).

In the next procedural stage S90, power-level values $\hat{P}_k$ erroneously determined in the preceding procedural stage S80 are separated out for further processing using two plausibility tests. In the first plausibility test, each power-level value $\hat{P}_k$ is compared with a noise-power threshold $thres_{noise}$. If the respective power-level value $\hat{P}_k$ falls below the noise power threshold $thres_{noise}$, it is discarded. In the second plausibility test, every power-level value $P_k$ is compared with a dynamic threshold $thres_{dynamic}$. In this context, every power-level value $\hat{P}_k$, which is disposed below the dynamic threshold $thres_{dynamic}$ of the maximum spur power $\max(\hat{p})$ of the respective power-level curve is discarded.

In the next procedural stage S100, the respective frequency $f_k$ is determined according to equation (35) for every spectral line, of which the power-level value $\hat{P}_k$ was not discarded in the previous procedural stage S90.

In the final procedural stage S110, a list is prepared with all of the spectral lines at the frequencies $f_k$ within a half-decade i ($HD_i$), which are to be removed. This procedural stage S110 is subdivided into a subroutine, which will be presented in greater detail below.

Figure 10:
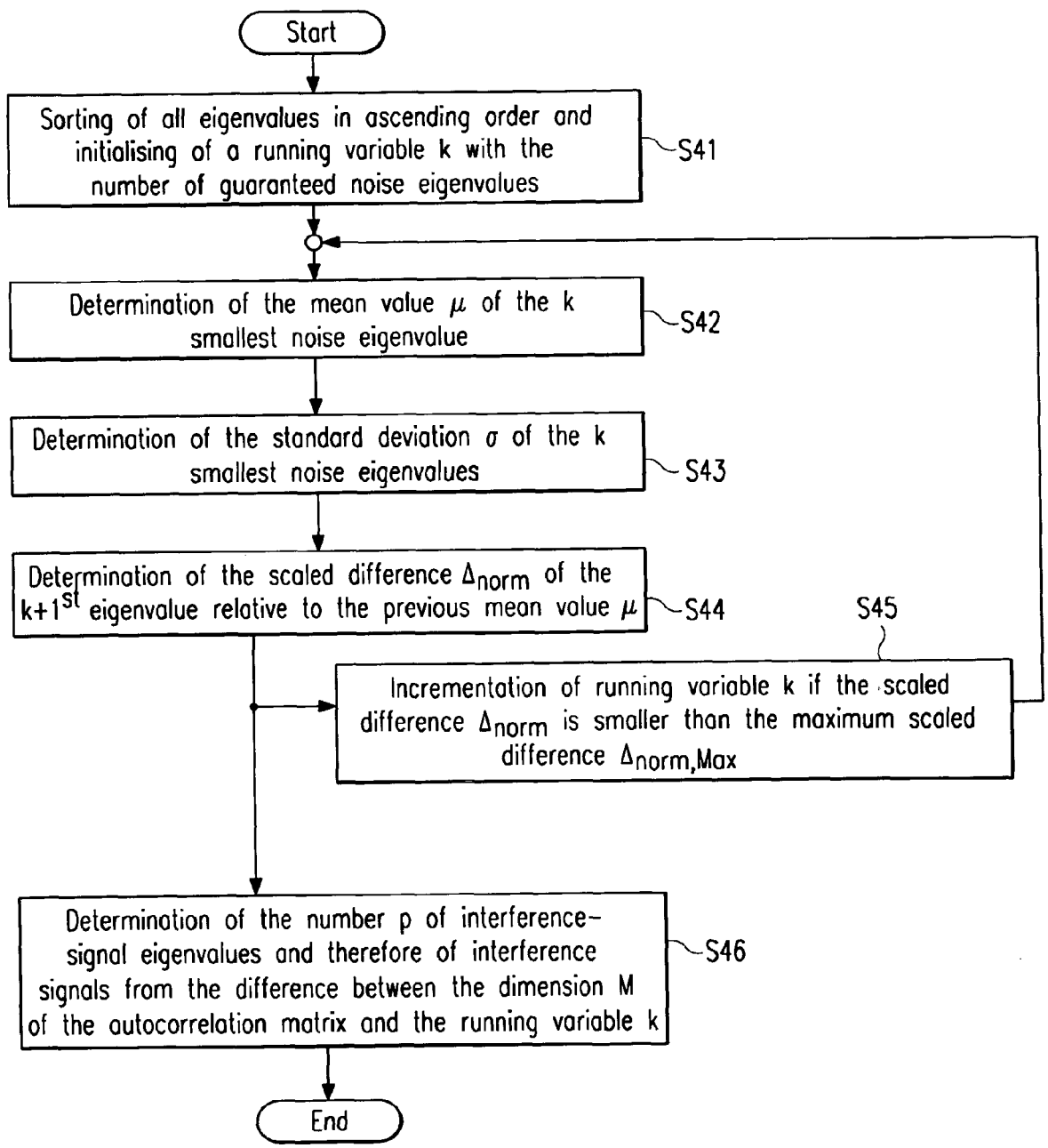
FIG. 10 shows a flow chart for a method according to the invention for determining the number of noise eigenvalues and interference-signal eigenvalues from all eigenvalues of an autocorrelation matrix.

In the following section, the subroutine according to the invention for determining the number of noise eigenvalues and interference-signal eigenvalues from eigenvalues obtained by means of eigenvalue analysis of an autocorrelation matrix is explained with reference to FIG. 10:

In procedural stage S41, all of the eigenvalues determined in procedural stage S30 by means of eigenvalue analysis of an autocorrelation matrix are sorted in ascending order. At the same time, a running variable k is defined with the number of previously-guaranteed noise eigenvalues.

In the next procedural stage S42, the mean value $\mu$ of the respective k smallest noise eigenvalues is determined according to equation (48).

$$\mu = \frac{1}{k} \cdot \sum_{i=1}^{k} \lambda_i \tag{48}$$

The next procedural stage S43 contains the determination of the standard deviation $\sigma$ of the respective k smallest noise eigenvalues according to equation (49).

$$\sigma = \sqrt{\frac{1}{k} \cdot \sum_{i=1}^{k} |\lambda_i - \mu|} \tag{49}$$

In the next procedural stage S44, the scaled difference $\Delta_{norm}$ of the k+1$^{st}$ eigenvalue relative to the previous mean value $\mu$ is determined according to equation (50).

$$\Delta_{norm} = \frac{\lambda_{k+1} - \mu}{\sigma} \tag{50}$$

If the scaled difference $\Delta_{norm}$ of the k+1$^{st}$ eigenvalue is smaller than a maximum scaled difference $\Delta_{normMax}$ and accordingly, the k+1$^{st}$ eigenvalue represents a further noise eigenvalue, the running variable k is incremented in the next procedural stage S45, and the respectively next-largest eigenvalue is taken into consideration in the determination of the mean value $\mu$ in procedural stage S42.

If the scaled difference $\Delta_{norm}$ of the k+1$^{st}$ eigenvalue is greater than a maximum scaled difference $\Delta_{normMax}$, and accordingly the k+1$^{st}$ eigenvalue does not represent a noise eigenvalue, but rather, the first interference-signal eigenvalue, the number p of interference-signal eigenvalues and accordingly of interference signals is determined in procedural stage S46 from the difference between the dimension M of the autocorrelation matrix and the current value of the running variable k, and the subroutine according to the invention for determining the number of noise eigenvalues and interference-signal eigenvalues is stopped.

Figure 11:
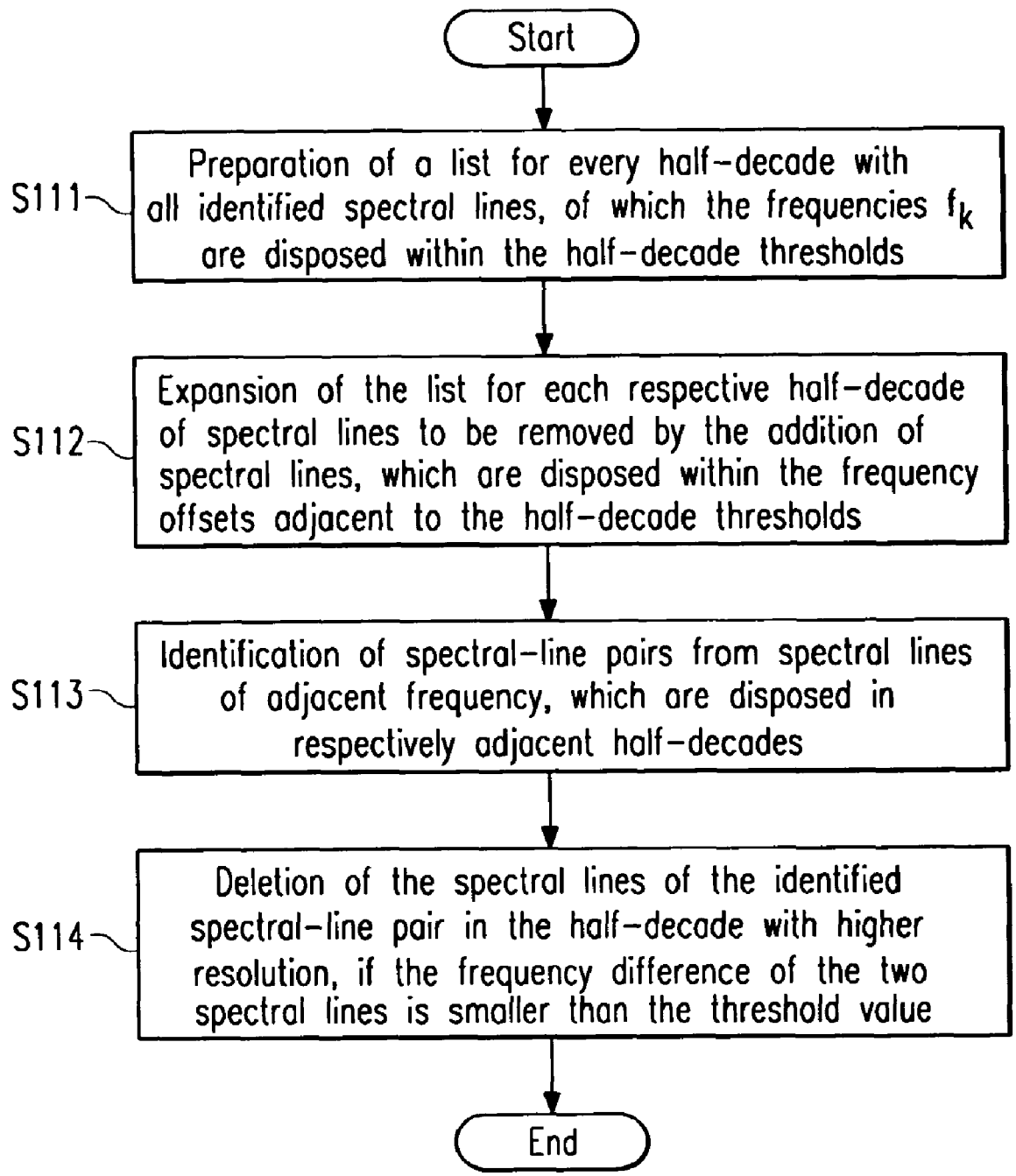
FIG. 11 shows a flow chart for a method according to the invention for the preparation of lists of spectral lines to be removed in each half-decade.

The following section presents the subroutine for preparing a list with all of the sinusoidal interference signals at the frequencies $f_k$, which are to be removed with reference to FIG. 11:

In the first procedural stage S111, a list is prepared containing all of the spectral lines identified in the method according to the invention for the identification of sinusoidal interference signals in a noise signal, of which the frequencies $f_k$ are disposed within the frequency range to be investigated.

In the next procedural stage S112, the list prepared in procedural stage S111 with all of the identified spectral lines is expanded by the addition of those spectral lines, which come to be disposed in the frequency offset according to equation (45) adjacent to the lower and upper half-decade threshold $f_{uG}(HD_i)$ and $f_{oG}(HD_i)$ respectively. The lists prepared in this manner contain, for each half-decade i ($HD_i$), the respective spectral lines to be removed.

In the next procedural stage S113, all of the spectral lines, disposed in the proximity of half-decade thresholds, erroneously identified in both half-decades and therefore counted twice, are identified. These spectral-line pairs result from spectral lines, of which the frequencies are arranged in direct succession and which are assigned respectively to an adjacent half-decade i and i+1 ($HD_i$) and ($HD_{i+1}$) according to condition (46).

In the final procedural stage S114, the spectral line of the spectral-line pair identified in the preceding procedural stage S113 is deleted from the list for the half-decade i ($HD_i$), which provides a higher frequency resolution, if the frequency difference $f_{k+1} - f_k$ of the two spectral lines of the identified spectral-line pair according to condition (47) is smaller than a specified threshold value.

Figure 12:
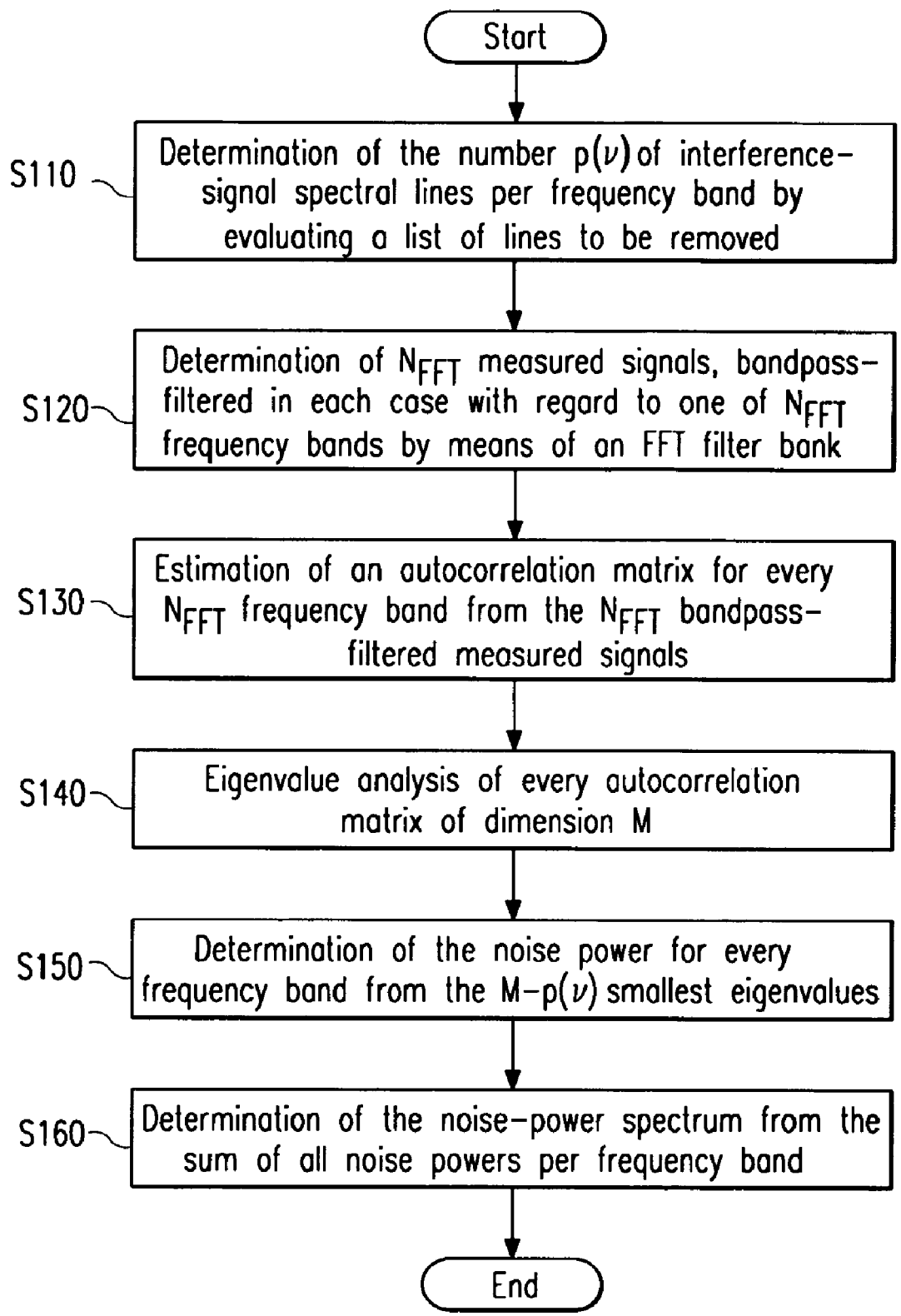
FIG. 12 shows a flow chart for a method according to the invention for the removal of sinusoidal interference signals from a noise signal.

In the following section, the method according to the invention for the removal of sinusoidal interference signals from a noise signal is described with reference to FIG. 12

In the first procedural stage S110, the number p(ν) of interference-signal spectral lines to be removed is determined for every frequency band ν, starting from a list of all sinusoidal interference signals identified in the frequency range. In this context, all spectral lines, of which the frequencies according to equation (36) do not satisfy the Nyquist condition and which are not useful for further processing are discarded. The frequency band $v_{Center}$ according to equation (37), in which the main line of the sinusoidal interference signal comes to be disposed, is calculated in order to determine the number p(ν) of interference-signal spectral lines per frequency band ν to be removed, starting from the frequency $f_k$ of the identified sinusoidal interference signal. All frequency bands according to equation (38), in which respectively a main line or one of the subsidiary lines of the sinusoidal interference signal are disposed, are determined on this basis.

In the next procedural stage S120, by analogy with procedural stage S10 in the method according to the invention for the identification of sinusoidal interference signals in a noise signal, a total of $N_{FFT}$ measured signals, of which the frequency spectra are bandpass-filtered respectively with reference to one of the frequency bands ν, is determined. The total of $N_{FFT}$ measured signals, of which the frequency spectra are bandpass-filtered respectively with regard to one of the frequency bands ν, is determined according to equation (1) via an FFT filter bank 1'.

In the next procedural stage S130, by analogy with procedural stage S20 in the method according to the invention for the removal of sinusoidal interference signals in a noise signal, an estimate $\hat{R}_v$ of an autocorrelation matrix associated with each frequency band ν is calculated starting from the total of $N_{FFT}$ measured signals, of which the frequency spectra are each bandpass-filtered with regard to one of the frequency bands ν according to equation (10). In this context, as a result of the stochastic characteristic of the noise signal, the unbiased quality of the estimate $\hat{R}_v$ of the respective autocorrelation matrix associated with each frequency band ν is increased by multiple averaging.

The next procedural stage S140 contains the eigenvalue analysis, by means of a known mathematical method, of each of the autocorrelation matrices, which are assigned to each frequency band ν.

With reference to the number p(ν) of noise eigenvalues determined in procedural stage S110 for each frequency band ν, in procedural stage S150, the noise power $\sigma_{w,v}$ is calculated for each frequency band ν from the sum of the M−p(ν) smallest respective eigenvalues, wherein M is the dimension of the estimate $\hat{R}_v$ of the autocorrelation matrix associated with the frequency band ν.

In procedural stage S160, the total discrete noise-power spectrum $\hat{S}(v \cdot f_0)$ is determined from the noise powers $\sigma_{w,v}$ associated with each of the individual frequency bands ν, which were determined in the previous procedural stage S150.

In the following section, the system according to the invention for the identification of sinusoidal interference signals in a noise signal is described with reference to FIG. 13:

The continuous or time-discrete measured signal x(t) or x(ν·Δt) consists of a continuous or time-discrete noise signal w(t) or w(ν·Δt) and several continuous or time-discrete sinusoidal interference signals $A_k \cdot e^{j(\omega_k t + \phi_k)}$ or $A_k \cdot e^{j(\mu \cdot \omega_k \Delta t + \phi_k)}$. This continuous or time-discrete measured signal x(t) or x(ν·Δt) is processed in an FFT filter bank 1, of which the structure is presented in detail in FIG. 3, in a total of $N_{FFT}$ overlapping FFTs. The continuous or time-discrete measured signal x(t) or x(ν·Δt), of which the respective frequency spectra are bandpass-filtered with regard to a given frequency band ν in the windowings $2_1, 2_2, \ldots, 2_{N_{FFT}}$ assigned to the individual FFTs and in the subsequent down mixings $3_1, 3_2, \ldots, 3_{N_{FFT}}$. The individual measured signals, of which the frequency spectrum is bandpass-filtered with regard to a frequency band ν, are then restored to the original sampling rate in subsequent undersamplings $4_1, 4_2, \ldots, 4_{N_{FFT}}$, with reference to the oversampling caused by the overlap, as shown in FIG. 3.

The measured signals x(ν·ov·Δt), of which the respective frequency spectrum is bandpass-filtered with regard to a frequency band ν, are supplied at the total of $N_{FFT}$ outputs of the FFT filter bank 1, to the units $5_1, 5_2, \ldots, 5_{N_{FFT}}$ for the estimation of the autocorrelation matrix $\hat{R}_v$. The individual eigenvalues and eigenvectors of the estimate $\hat{R}_v$ of the autocorrelation matrix associated with the respective frequency band ν are additionally determined in the respective unit $5_1, 5_2, \ldots, 5_{N_{FFT}}$ for the estimation of the autocorrelation matrix $\hat{R}_v$ from the estimate $\hat{R}_v$ associated with the respective frequency band ν of the autocorrelation matrix.

In a subsequent unit $6_1, 6_2, \ldots, 6_{N_{FFT}}$ for determining the number p(ν) of interference signals per frequency band ν, a separation of all eigenvalues $\lambda_1, \ldots, \lambda_M$ determined at the estimated value $\hat{R}_v$ of the autocorrelation matrix associated with the frequency band ν into noise eigenvalues $\lambda_1, \ldots, \lambda_M$ and interference-eigenvalues $\lambda_1, \ldots, \lambda_{M-p(v)-1}$ takes place. The number p(ν) of interference signals per frequency band ν corresponds to the number of determined interference-signal eigenvalues $\lambda_{M-p(v)}, \ldots, \lambda_M$ of the estimate $\hat{R}_v$ associated with the frequency band ν of the autocorrelation matrix.

The subsequent units $7_1, 7_2, \ldots, 7_{N_{FFT}}$ determine respectively the noise power $\sigma_{w,v}$ of the frequency band ν from the noise eigenvalues $\lambda_1, \ldots, \lambda_{M-p(v)-1}$, which corresponds respectively to a given number of smallest eigenvalues determined in the units $5_1, 5_2, \ldots, 5_{N_{FFT}}$ for the estimation of the autocorrelation matrix $\hat{R}_v$, wherein the given number represents the dimension M reduced by the number p(ν) of interference signals per frequency band ν of the estimate $\hat{R}_v$ associated with the frequency band ν of the autocorrelation matrix.

The subsequent units $8_1, 8_2, \ldots, 8_{N_{FFT}}$ for frequency estimation determine, for example, via the MUSIC method using an estimation function by means of a maximum value observation, the scaled angular frequencies $\omega_{normk}$ of the interference-signal spectral lines occurring in the respective frequency band ν. In this context, the maxima occur in those cases, in which the eigenvectors $\underline{v}_1, \ldots, \underline{v}_{M-p(v)-1}$ associated with the respective noise eigenvalues $\lambda_1, \ldots, \lambda_{M-p(v)-1}$ are orthogonal to an arbitrary column vector $\underline{e}_i$ of the signal autocorrelation matrix $R_s$ of the respective frequency band ν.

Finally, the power-level values $P_{MU,v,k}$ associated with the individual interference-signal spectral lines in the individual frequency bands $\nu$ are determined in subsequent units $9_1$, $9_2, \ldots, 9_{NFFT}$ for power-level measurement, starting from the noise powers $\sigma_{w,\nu}$, the interference-signal eigenvalues $\lambda_{M-p(\nu)+1}, \ldots, \lambda_M$ and the Z-transforms $V_i(e^{j\omega_{normk}})$ of the interference-signal eigenvectors $\underline{v}_1, \ldots, \underline{v}_{M-p(\nu)-1}$ at the individual determined, scaled angular frequencies $\omega_{normk}$ of the individual interference-signal spectral lines.

In a subsequent unit 10 for the measurement of power-level curves per determined, scaled angular frequency $\omega_{normk}$, all of the power-level values $P_{MU,\nu,k}$ of spectral lines, which provide approximately identical scaled angular frequencies $\omega_{normk}$ in different frequency bands $\nu$, are combined at the individual FFT bin frequencies $\nu \cdot f_0$ of the FFT filter bank 1 to form a power-level curve.

In a final unit 11 for determining individual spectral lines from a superimposed spectral line, the power-level values $\hat{P}_k$ of individual spectral lines, which result from different sinusoidal interference signals with frequencies $f_k$ in different frequency bands $\nu$ and which are superimposed at an identical scaled angular frequency $\omega_{normk}$ to form a single spectral line, are determined. This superimposition of individual spectral lines, which is based upon the occurrence of subsidiary lines of sinusoidal interference signals because of leakage effects caused by windowing in respectively adjacent frequency bands $\nu$ and the superposition, accurate with regard to frequency, of main lines of sinusoidal interference signals, is reversed by a deconvolution. For this purpose, a linear equation system with a matrix H comprising the modulus-squared window transmission functions $|H(f-\nu \cdot f_0)|^2$ frequency-displaced by the respective FFT bin frequency $\nu \cdot f_0$, the vector $\underline{P}_{MU,\nu}$ with the power-level values $P_{MU,\nu,k}$ determined at the respective scaled angular frequency $\omega_{normk}$ in the individual adjacent frequency bands in the units $9_1, 9_2, \ldots 9_{NFFT}$ for power level measurement and the vector $\underline{\hat{P}}$ of the sought power-level values $\hat{P}_k$ of the associated individual spectral lines, is resolved.

After discarding erroneous power-level values $\hat{P}_k$ and a subsequent determination of the frequencies $f_k$ associated with the power-level values $\hat{P}_k$ of the determined spectral lines in the unit 11 for determining individual spectral lines from a superimposed spectral line, the individual, identified spectral lines with their respective power-level values $\hat{P}_k$ and frequencies $f_k$ are entered in respective lists.

Figure 13:
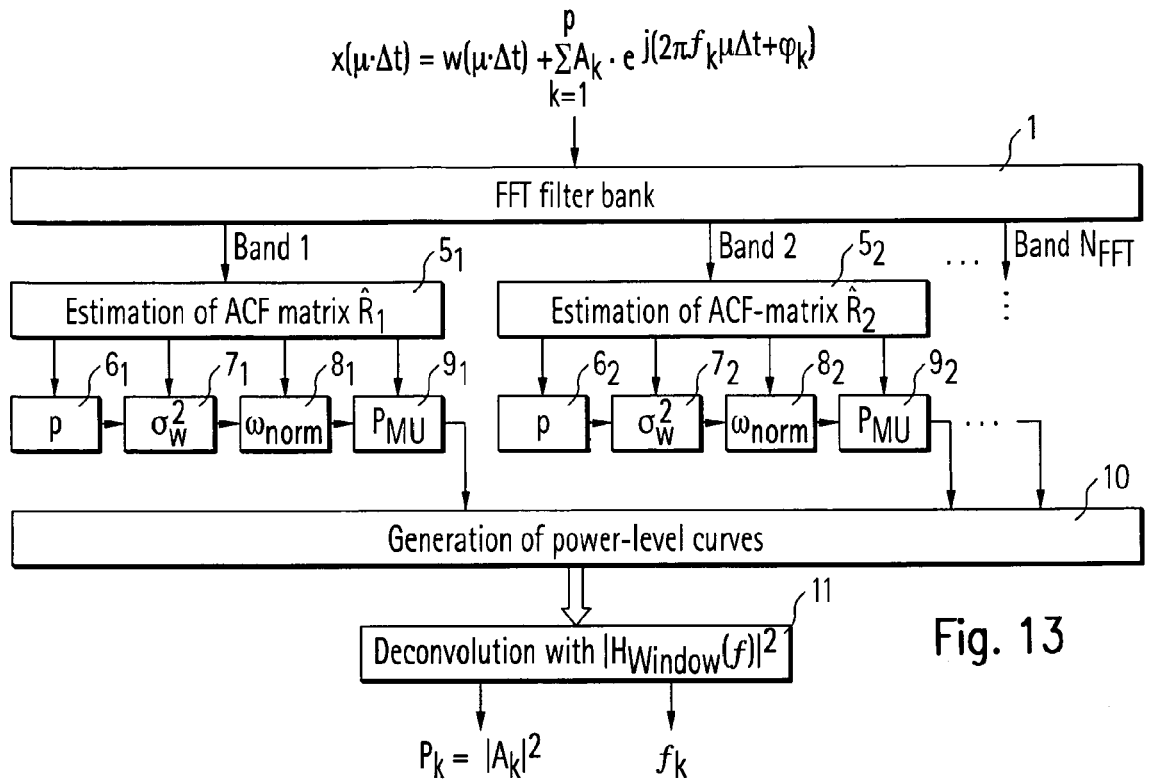
FIG. 13 shows a block diagram of a system according to the invention for the detection of sinusoidal interference signals in a noise signal.
Figure 14:
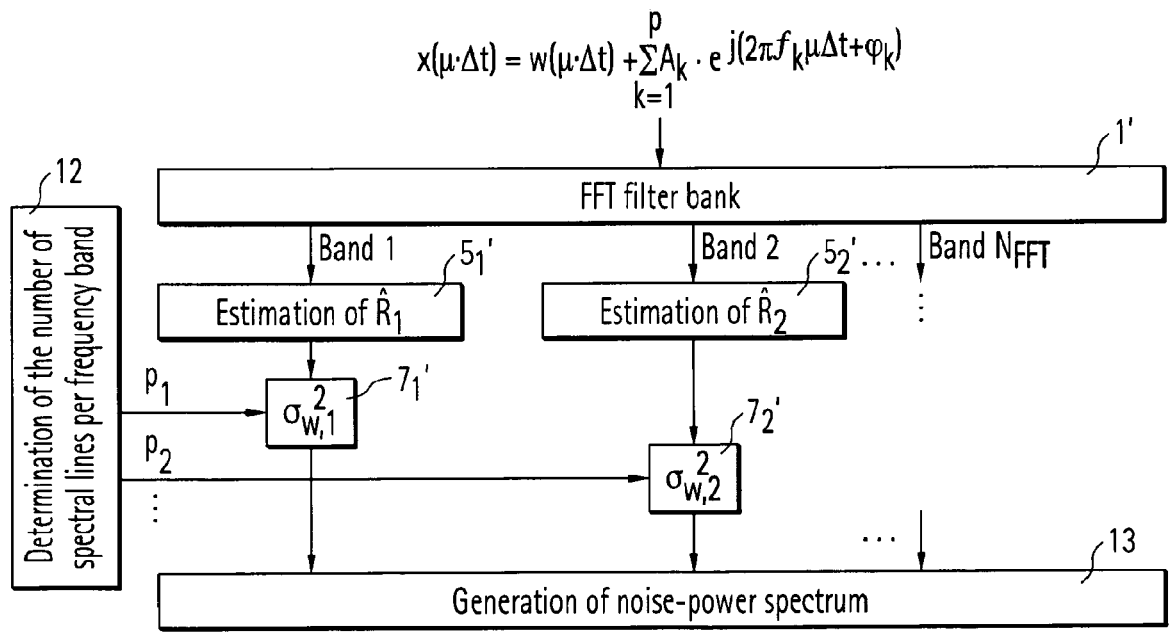
FIG. 14 shows a block diagram of a system according to the invention for the removal of sinusoidal interference signals in a noise signal.

In the following section, the system according to the invention for the removal of sinusoidal interference signals from a noise signal will be described with reference to FIG. 14:

By analogy with the system according to the invention for the identification of sinusoidal interference signals in a noise signal according to FIG. 13, the system according to the invention for the removal of sinusoidal interference signals in a noise signal contains an FFT filter bank 1' for the determination of a total of $N_{FFT}$ measured signals, of which the frequency spectrum is bandpass-filtered respectively at a given frequency band $\nu$, and a total of $N_{FFT}$ subsequent units $5_1', 5_2', \ldots, 5_{NFFT}'$ for the estimation of estimated values associated with the individual frequency bands $\nu$ of the autocorrelation matrices and a total of $N_{FFT}$ subsequent units $7_1', 7_2', \ldots, 7_{NFFT}'$ for the determination of the noise power $\sigma_{w,\nu}$ associated with the respective frequency band $\nu$. A detailed description of these units will not be provided here, because they are structured in an equivalent manner to the respective units of the system according to the invention for the identification of sinusoidal interference signals in a noise signal.

The system for the removal of sinusoidal interference signals in a noise signal additionally contains a unit 12 for determining the number of sinusoidal interference signals per frequency band. The number $p(\nu)$ of sinusoidal interference signals per frequency band $\nu$, which are supplied to the individual units $7_1', 7_2', \ldots, 7_{NFFT}'$ for the determination of the noise powers $\sigma_{w,\nu}$ associated with the respective frequency band $\nu$, is determined by evaluating a list with the frequencies $f_k$ of all spectral lines of sinusoidal interference signals to be removed.

The individual units $7_1', 7_2', \ldots, 7_{NFFT}'$ for determining the noise powers $\sigma_{w,\nu}$ associated with the individual frequency bands $\nu$ are connected to a unit 13 for generating the noise-power spectrum $\hat{S}(\nu)$, which determines the noise-power spectrum $\hat{S}(\nu)$ of the entire frequency range to be measured.

Figure 15:
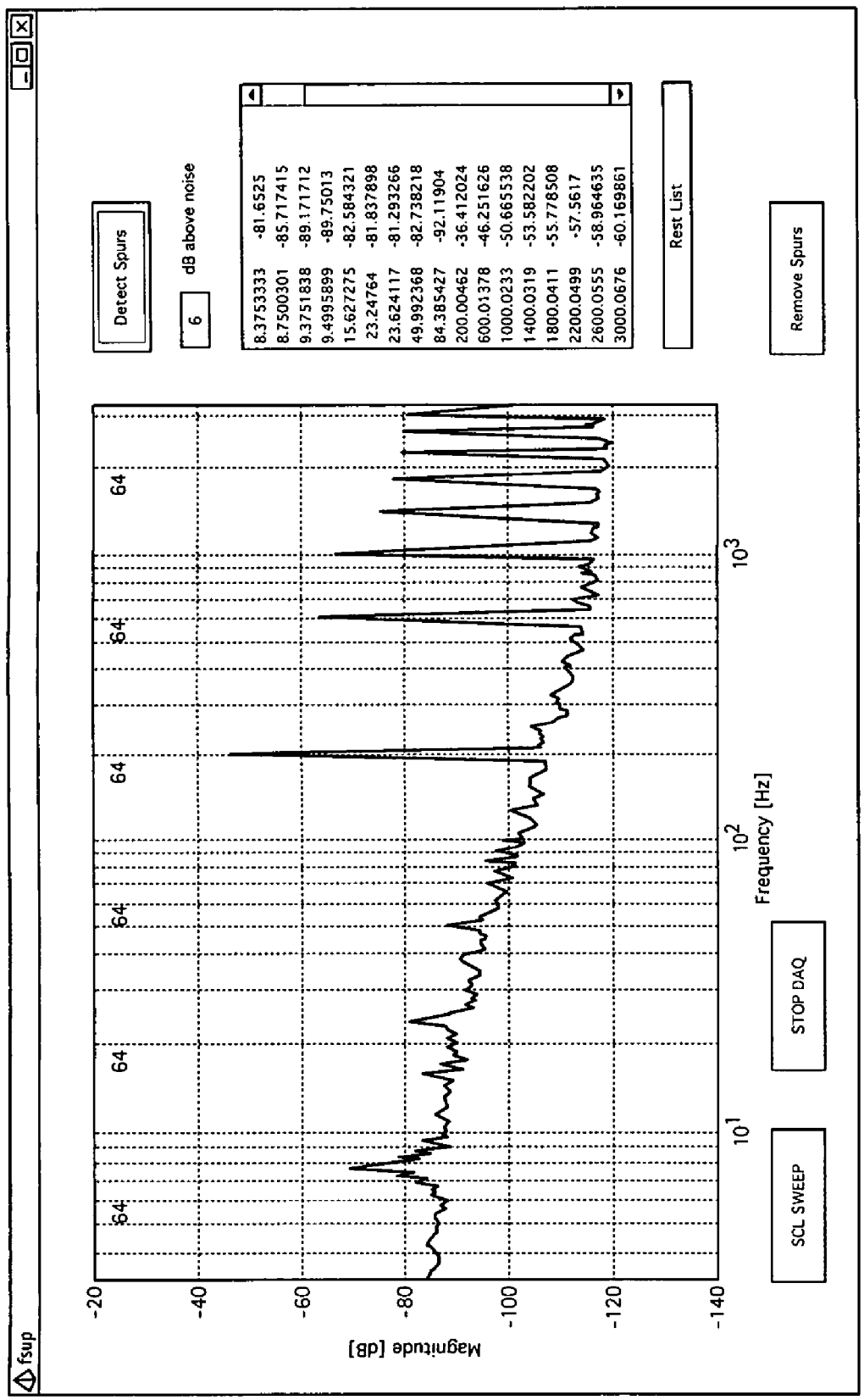
FIG. 15 shows a spectral display of a noise spectrum contaminated with spectral lines of sinusoidal interference signals.
Figure 16:
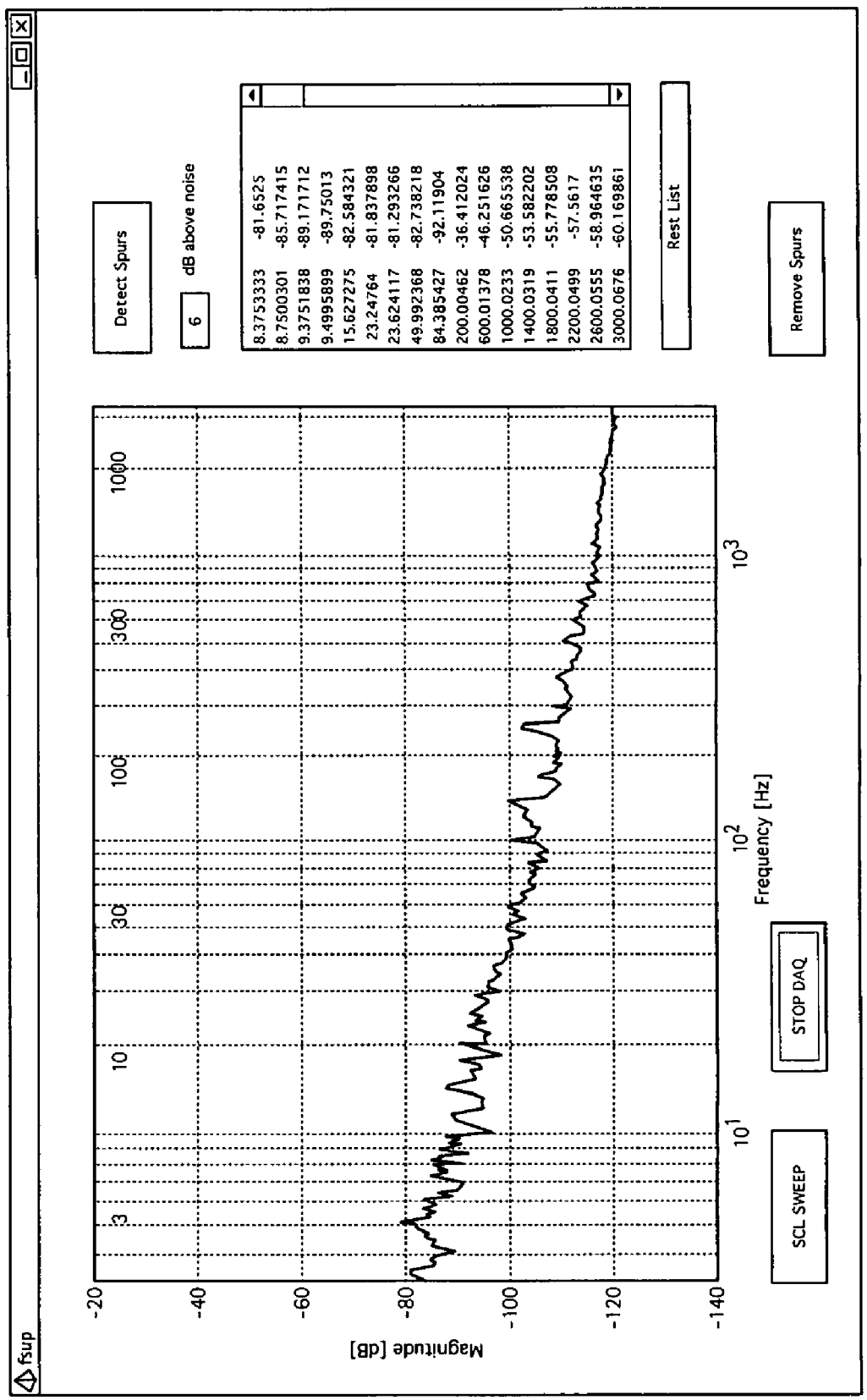
FIG. 16 shows a spectral display of a noise spectrum with spectral lines of sinusoidal interference signals removed.

FIG. 15 presents a phase-noise spectrum with superimposed spectral lines of sinusoidal interference signals. The display also contains the frequencies at which spectral lines of sinusoidal interference signals have been identified by the method and the system according to the invention for the identification of sinusoidal interference signals in a noise signal. FIG. 16 shows the identical phase-noise spectrum to that shown in FIG. 15, from which spectral lines associated with sinusoidal interference signals have been removed by the method and the system according to the invention for the removal of sinusoidal interference signals in a noise signal.

The invention is not restricted to the embodiment presented. In particular, instead of the MUSIC method, other frequency estimation methods, which are based upon an eigenvalue analysis of autocorrelation matrices, such as the Pisareko method can also be used. The invention also covers alternative methods to the Welch method, such as the Bartlett method. Other window functions can also be used for the windowing of the measured signal in the FFT filter bank, instead of the named Chebyshev or rectangular windows. The time overlap of the individual FFTs in the FFT filter bank is also not essential to the actual idea of the invention.

The invention claimed is:

1. A method comprising:
   transforming a measured signal $(x(t), x(\mu \cdot \Delta t))$, which is composed of a limited number $(p(\nu))$ of sinusoidal interference signals $(A_k \cdot e^{j(\omega_k t + \Phi_k)}, A_k \cdot e^{j(\omega_k \mu \cdot \Delta t + \Phi_k)})$ and a white noise signal $(w(t), w(\mu \cdot \Delta t))$, into a subspace containing white noise components and a subspace containing interference-signal components, and
   forming a spectrum of only the white noise signal using the subspace containing the white noise components,
   wherein an entire frequency range of the measured signal is split into several frequency bands $(\nu)$ via a filter bank.

2. The method according to claim 1, wherein a noise-power spectrum $\hat{S}(\nu \cdot f_0)$ of the measured signal $(x(t), x(\mu \cdot \Delta t))$, after a removal of the sinusoidal interference signals $(A_k \cdot e^{j(\omega_k t + \Phi_k)}, A_k \cdot e^{j(\mu \cdot \omega_k \Delta t + \Phi_k)})$, is formed from a noise power $(\sigma_{w,\nu})$ of each of the frequency bands $(\nu)$.

3. The method according to claim 1, wherein the splitting of the entire frequency range into several frequency bands $(\nu)$ takes place via a Fast Fourier Transform (FFT) filter bank as the filter bank.

4. The method according to claim 3, wherein a bandwidth $(\Delta f)$ of a frequency band $(\nu)$ corresponds to a bin width $(f_0)$ of a Fast Fourier Transform.

5. The method according to claim 3, wherein through a windowing in a Fast Fourier Transform, individual spectral lines of sinusoidal interference signals $(A_k \cdot e^{j(o \nu \cdot \omega_k \mu \cdot \Delta t + \Phi_k)})$, of which frequencies $(f_k)$ are disposed in different frequency bands $(\nu)$, are disposed in at least one of the frequency bands $(\nu)$ and form superimposed spectral lines.

6. The method according to claim 5, wherein a number $(p(\nu))$ of superimposed spectral lines per frequency band $(\nu)$ associated with sinusoidal interference signals is determined from the specified frequencies ($f_k$) of the sinusoidal interference signals ($A_k \cdot e^{j(\omega_k t + \phi_k)}$) to be removed.

7. The method according to claim 6, wherein a respective noise power ($\sigma_{w,v}$) for each frequency band (v) is determined only from a given number (M−p(v)) of lowest eigenvalues ($\lambda_1, \ldots, \lambda_{M-p(v)}$) of an autocorrelation matrix ($\hat{R}_v$) associated with the respective frequency band (v), wherein a number (M−p(v)) of the lowest eigenvalues ($\lambda_1, \ldots, \lambda_{M-p(v)}$) is a dimension (M) of the autocorrelation matrix ($\hat{R}_v$) reduced by a number (p(v)) of the superimposed spectral lines per frequency band (v).

8. The method according to claim 1, wherein for each frequency band (v), an autocorrelation matrix ($\hat{R}_v$) is formed from the respective frequency-band measured signal (x(t), x(μ·Δt), of which eigenvalues ($\lambda_1, \ldots, \lambda_1$) are subdivided into a first group with low-value eigenvalues ($\lambda_1, \ldots, \lambda_{M-p(v)}$) and a second group with higher-value eigenvalues ($\lambda_{M-p(v)+1}, \ldots, \lambda_M$), wherein each of the low-value eigenvalues ($\lambda_1, \ldots, \lambda_{M-p(v)}$) provides a significant value difference relative to each of the higher-value eigenvalues ($\lambda_{M-p(v)+1}, \ldots, \lambda_M$).

9. The method according to claim 8, wherein the first group of low-value eigenvalues ($\lambda_1, \ldots, \lambda_{M-p(v)}$) forms the subspace containing the noise components, and the second group of higher-value eigenvalues ($\lambda_{M-p(v)+1}, \ldots, v_M$) forms the subspace containing the interference-signal components.

10. The method according to claim 8, wherein a respective noise power ($\sigma_{w,v}$) for each frequency band (v) is determined only from all of the eigenvalues ($\lambda_1, \ldots, \lambda_{M-p(v)+1}$) of the autocorrelation matrix ($\hat{R}_v$) associated with the respective frequency band (v), which form the subspace containing the noise components.

11. A method comprising:
splitting a measured signal that includes sinusoidal interference signals and a noise signal into plural frequency bands via a filter bank to form plural frequency-band measured signals, each frequency-band measured signal includes a limited number of the sinusoidal interference signals and the noise signal, the noise signal including at least white noise components;
transforming each frequency-band measured signal into a subspace containing the white noise components and a subspace containing interference-signal components; and
forming a spectrum of only the noise signal using the subspace containing the white noise components.

* * * * *